(12) United States Patent
Renwick et al.

(10) Patent No.: US 8,438,507 B2
(45) Date of Patent: May 7, 2013

(54) SYSTEMS AND METHODS FOR ADJUSTING A LITHOGRAPHIC SCANNER

(75) Inventors: Stephen P. Renwick, San Bruno, CA (US); Koichi Fujii, Saitama (JP)

(73) Assignees: Nikon Corporation, Tokyo (JP); Nikon Precision Inc., Belmont, CA (US)

(*) Notice: Subject to any disclaimer, the term of this patent is extended or adjusted under 35 U.S.C. 154(b) by 490 days.

(21) Appl. No.: 12/570,845

(22) Filed: Sep. 30, 2009

(65) Prior Publication Data

US 2010/0125823 A1 May 20, 2010

Related U.S. Application Data

(60) Provisional application No. 61/116,374, filed on Nov. 20, 2008.

(51) Int. Cl.
*G06F 17/50* (2006.01)

(52) U.S. Cl.
USPC ............ 716/54; 716/50; 716/51; 716/52; 716/53; 716/55; 430/5; 430/30

(58) Field of Classification Search .......... 716/50–55; 430/5, 30
See application file for complete search history.

(56) References Cited

U.S. PATENT DOCUMENTS

| | | | |
|---|---|---|---|
| 5,773,174 A * | 6/1998 | Koizumi et al. | 430/30 |
| 5,965,306 A * | 10/1999 | Mansfield et al. | 430/22 |
| 7,073,924 B2 | 7/2006 | Koizumi et al. | |
| 7,116,411 B2 * | 10/2006 | Park et al. | 356/124 |
| 7,123,346 B2 | 10/2006 | Koizumi et al. | |
| 7,164,960 B2 | 1/2007 | Komine et al. | |
| 7,262,831 B2 * | 8/2007 | Akhssay et al. | 355/52 |
| 7,537,870 B2 * | 5/2009 | Crouse et al. | 430/30 |
| 7,652,758 B2 * | 1/2010 | Park et al. | 356/124 |
| 2005/0164095 A1 | 7/2005 | Ozawa | |
| 2009/0053628 A1 * | 2/2009 | Ye et al. | 430/30 |

FOREIGN PATENT DOCUMENTS

| | | |
|---|---|---|
| JP | 2006-229042 | 8/2006 |
| WO | 2005/055295 | 6/2005 |

OTHER PUBLICATIONS

Look et al., Tool-to-tool optical proximity effect matching, Feb. 26, 2008, SPIE, vol. 6924, pp. 1-12.*
L. Van Look et al. "Tool-to-tool optical proximity effect matching".
G.L.-T. Chiu et al. Optical Lithography:Introduction, vol. 41, Nos. ½, 1997.
A.M. Ziblod et al. Aerial Image Measurement Technique for fast evaluation of 193 nm lithography masks, downloaded Oct. 16, 2008 (date Unknown).

* cited by examiner

*Primary Examiner* — Nghia Doan
(74) *Attorney, Agent, or Firm* — Andrew M. Calderon; Roberts Mlotkowski Safran & Cole, P.C.

(57) ABSTRACT

A system and methods are provide for modeling the behavior of a lithographic scanner and, more particularly, a system and methods are provide using thresholds of an image profile to characterize through-pitch printing behavior of a lithographic scanner. The method includes running a lithographic model for a target tool and running a lithographic model on the matching tool for a plurality of different settings using lens numerical aperture, numerical aperture of the illuminator and annular ratio of a pattern which is produced by an illuminator. The method then selects the setting that most closely matches the output of the target tool.

32 Claims, 12 Drawing Sheets

SYSTEMS AND METHODS FOR ADJUSTING A LITHOGRAPHIC SCANNER

CROSS REFERENCE TO RELATED APPLICATIONS

This application claims priority to provisional U.S. Application Ser. No. 61/116,374, filed on Nov. 20, 2008, the contents of which are incorporated by reference herein in their entirety.

BACKGROUND OF THE INVENTION

1. Field of the Invention

The invention relates to systems and methods for modeling the behavior of a lithographic scanner and, more particularly, to systems and methods of using thresholds of an image profile to characterize printing behavior of a lithographic scanner.

2. Background Description

Any lithographic scanner takes a pattern on a mask, projects it through the lens, and makes an aerial image at the wafer plane. Because the lens can only collect finite orders of diffracted light and the lens is not perfect, the aerial image looks distorted when compared to the mask image. This is shown representatively in FIG. 1, for example. In order to obtain the desired image, chip makers typically make corrections on a reticle to adjust for optical proximity effects (OPE) for a specific scanner. This is a time consuming and costly process.

As Optical Proximity Correction (OPC) has enjoyed increased use, it has been recognized that a variety of lithographic parameters can strongly affect the OPC behavior of a scanner. Anecdotes abound in the industry, with tales of carefully-crafted OPC solutions suddenly failing to work when a process is run on a scanner made by a different manufacturer, or on a scanner made by the same manufacturer but with a different lens, or even on the same machine with different laser parameters. Given that OPC solutions require a considerable amount of time and effort to develop, this can be very disturbing.

OPC exists because of OPE. The purpose of OPC is to make the printed feature appear more like the designed feature, i.e., to negate OPE. In turn, the existence of OPE lies, of course, in the basic optical physics of image formation, especially at low k1 factors. Details of the optical design of the scanner have effects on the image formation and thus on OPE. This is frequently characterized by sets of data called OPE curves.

Drivers of OPE differences among scanners are broadly divided into two families. The first family of drivers is related to changes in lens NA (LNA), illuminator NA (INA) or annular ratio (AR). Those of skill in the art will recognize that the LNA and INA settings are frequently combined to calculate a term "sigma," where sigma=INA/LNA. Since the image in the scanner is formed by combining the 0, ±1, and ±2 . . . diffraction orders in the lens, an image of the pupil-fill illumination pattern appears at the location of those orders in the lens pupil, and since some orders are cut off by the lens NA limits, small changes in LNA or INA or differences in the pupil-fill intensity pattern will subtly affect imaging. Through-pitch behavior can also be strongly affected.

A second family of drivers arises primarily from chromatic aberration in the lens and the non-infinitesimal bandwidth of the illumination laser. All lithographic lenses are made of glass and crystalline materials that are dispersive and, as such, every lens will thus have a characteristic change in aberrations as the incident wavelength is varied. Lasers, on the other hand, are not truly monochromatic but instead have a certain center wavelength and bandwidth. Thus, at any given time, the lens is projecting not a single image, but rather a composite of several images, each formed at a different wavelength and therefore with a slightly different set of lens aberrations. The composite is made by integrating these multiple images over the laser bandwidth. Typically, since the primary aberration affected by wavelength shift is focus, this corresponds to combining a best-focus image with a selection of out-of-focus images.

Bandwidth differences and lens differences from one scanner to another will also cause OPE differences between scanners. Other methods of introducing composite image formation, such as deliberate stage tilt induced to perform focus drilling, will similarly have OPE effects. In matching tools, adjustments of laser bandwidth or focus drilling are used for compensation of these effects.

The invention is designed to solve one or more of the above-mentioned problems.

SUMMARY OF THE INVENTION

In a first aspect of the invention, a method of making adjustments to a scanner to match compensated optical proximity effects of another scanner used as the reference or target (and referred to as the "target tool") comprises running a lithographic model for the target tool and running a lithographic model of the (matching) scanner to match the target tool for a plurality of different settings on the scanner. The method further comprises providing settings for the scanner that most closely matches an output of the target tool based on the lithographic models of the target tool and the scanner.

In another aspect of the invention, a method of making adjustments to a scanner to match a target tool, comprising: collecting data from the target tool; running a lithographic model of a scanner to match the target tool for a plurality of different settings on the scanner; and providing settings for the scanner that most closely matches an output of the target tool based on non-linear optimization.

In another aspect of the invention, a system implemented on a computer infrastructure comprises program instructions stored on a storage media and being operable on the computer infrastructure. The program instructions include: first program instructions running a lithographic model for a target tool; second program instructions running a lithographic model of a scanner to match the target tool for a plurality of different settings on the scanner; and third program instructions providing settings for the scanner that most closely matches an output of the target tool based on the lithographic models of the target tool and the scanner.

In another aspect of the invention, a computer program product comprises a computer usable storage medium having readable program code tangibly embodied in the storage medium. The computer program product is operable to: collect data from the target tool; run a lithographic model of a scanner to match the target tool for a plurality of different settings on the scanner; and provide settings for the scanner that most closely matches an output of the target tool based on non-linear optimization.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF EMBODIMENTS OF THE INVENTION

Figure 1:
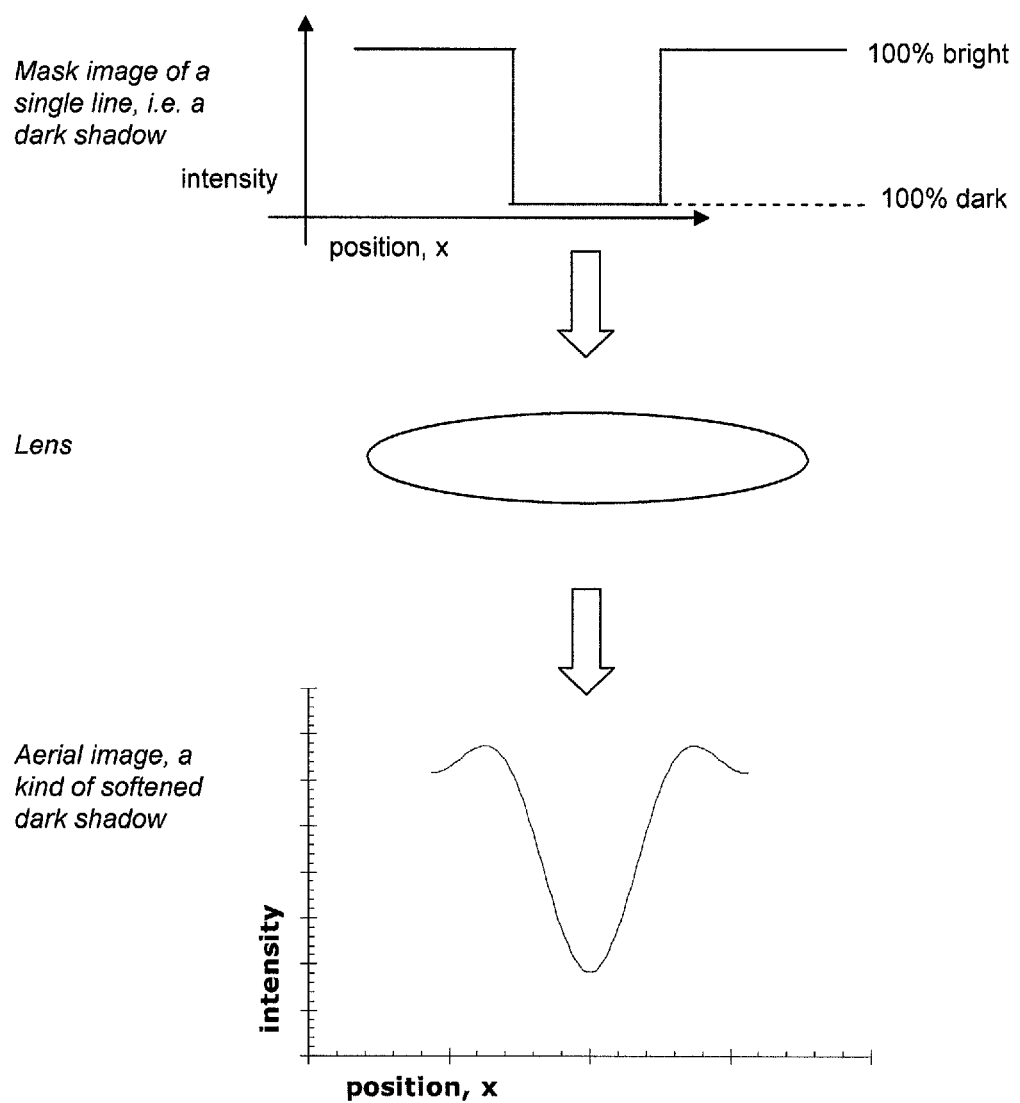
FIG. 1 shows a high level representation of an aerial image being imaged at the wafer plane.

The invention relates to systems and methods for modeling the behavior of a lithographic scanner and, more particularly, to systems and methods of using thresholds of an image profile to characterize printing behavior of a lithographic scanner. That is, the present invention provides systems and methods to automatically set up a scanner to match the behavior of another scanner (target tool), which is already in use by a customer (e.g., fabrication facility). This can be done without having the reticle of the customer process or other proprietary information of the customer process (e.g., proprietary pattern information or resist-process information). Instead, the present invention enables customers to take an existing OPC solution developed on a competitor scanner and automatically adjust the new (matching) scanner such that it will expose reticles with the same pattern and obtain equivalent results.

More specifically, the systems and methods are an automatic "OPE-matching" tool designed to match tool (e.g., scanner) settings between a matching tool and a target tool (e.g., a scanner that is currently being used by a customer). In such systems and methods aerial or resist images of different types of features are matched such that the matching tool can be adjusted (in calculation) until its set of aerial images, in one implementation, matches a target tool's set as closely as possible when both tools are using the same mask. In further embodiments, ratios of CDs from calculated images and real data can be used to match a matching tool's set of aerial images as closely as possible to that of the target tool. In all embodiments (e.g., aerial image, resist image, or ratio method), one or more intensity threshold on an aerial image or one or more metrology thresholds on the resist image can be implemented to "lock" through-dose performance for the matching tool.

Advantageously, the present invention will allow more precise characterization of a lithographic scanner (e.g., matching tool) in the area of scanner matching, without having to make the same corrections as already made with the target tool. For example, scanners from different manufacturers, e.g., Nikon and competitors, can now be matched in terms of OPC behavior, so the chipmaker customer does not have to perform OPC twice, or perform tedious and costly manual matching methods. Also, the present invention can be used in automatic scanner-matching software and/or hardware tools which will allow the matching tool manufacturer (e.g., Nikon) or a customer to calculate tool (e.g., scanner proposed for use to a fab) settings to match OPC behavior to an existing tool. With that available, it becomes easier either to introduce new scanners to a fab or to employ new scanners on chip layers for which competitor scanners were used, without having the reticle in which the optical proximity effects (OPE) were compensated in the target tool. Instead, the present invention can use test patterns to make the adjustments on a scanner that has not been tested and corrected by the chip maker. The system and methods also do not require the customer to employ standard test reticle and further allows the customer to use the customer's own test features

Overview of the Invention

In embodiments, the systems and methods of the present invention use aerial or resist image calculated by modeling the behavior of a lithographic scanner, referred to as the matching tool, in order to match precisely its behavior to that of a different scanner, referred to as the target tool. In embodiments, both aerial images and resist images can be calculated by lithographic modeling software, which may be custom or commercially available products. For example, the lithographic modeling software can be Prolith.

In implementation, it is possible to calculate matching tool response to adjustments such as LNA, INA, AR, stage tilting, and dose by performing repeated aerial-image calculations or resist calculations using the mask information and by varying matching-tool settings in the model. Adjustments can be made in the calculation of the aerial or resist image of the matching tool until the image output of the matching tool matches (or substantially matches) that of the target tool as closely as possible. The technique of matching aerial images is employed when information necessary to accurately calculate exposed-resist images is not available. Conversely, when certain information about the target tool is not available, and accurate aerial or resist images from the target tool therefore cannot be constructed, resist images of the matching tool can be modeled and matched to resist data from the target tool. In other embodiments, when neither the requisite target tool nor the requisite resist information is available, a ratio or hybrid method can be used. In embodiments, the exact matching criterion depends on the situation. For example, for single-threshold matching, the number of critical dimensions (CD) equals the number of images; whereas, for multi-threshold matching, the number of CDs is equal to the number of images multiplied by the number of used thresholds.

Modeled Image Methods

Model image methods can be used when certain information is available such as, for example, the particulars of both tools, e.g., lens numerical aperture (LNA), numerical aperture (NA) of the illuminator and annular ratio (AR) of the pattern which is produced by the illuminator, as well as intensity maps of illumination pattern produced by both tools, i.e., details of the intensity pattern of the illumination setting used in the tools (sometimes referred to as a pupilgram). In this method, resist information is not required to calculate the matching settings if aerial image is used. In further embodiments, the following information can also be used when using the modeled image data method to provide the modeling (e.g., adjustment to the scanner not yet used by the chip maker):
(i) laser bandwidth;
(ii) stage vibration; and/or
(iii) focus settings.

Those of skill in the art will recognize that, for the calculated aerial or resist images to be sufficiently accurate, certain information is needed about the matching tool and target tool. For example, as described in more detail below, this includes but is not limited to the details of the intensity pattern of the illumination setting used in the tools. This pattern is sometimes referred to as a pupilgram.

Bearing in mind, hereafter, the thresholds to get a same CD are different in two different machines, because illuminator and projection lens are different, in both aerial image method and ratio method. The threshold is determined, for example, by making an anchor pattern to be expected CD. In comparing aerial or resist images, the present invention calculates the CD of an aerial or resist image by drawing an image-intensity threshold line across the image. (In comparing resist images, CD is calculated similarly except that the line drawn across the image is referred to as a metrology threshold.) In either case, CD is defined as the distance between the two points where the threshold line intersects the image. Two different images, for example, an image from the target tool and an image from the matching tool are matched if the same threshold yields the same CD for two different images. In certain cases, however, it is possible for the same threshold to yield the same CD for two significantly different images. That is, the single threshold may or may not provide an accurate judgment of image matching and therefore may or may not accurately characterize output of the scanner.

In one contemplated embodiment, the invention uses at least two different thresholds on both images, and calculates at least two different CD numbers for each image, and requires them to be pairwise matched according to a criterion. That is, the first threshold yields two CDs that are matched, the second threshold yields two more CDs that also match each other, etc. Multiple thresholds of aerial images are obtained by running the process for CD calculation, described below, twice for two different heights. Multiple heights of resist images could be obtained, for instance, by measuring resist profiles via scatterometry and applying the process for CD calculation to the results.

Figure 2:
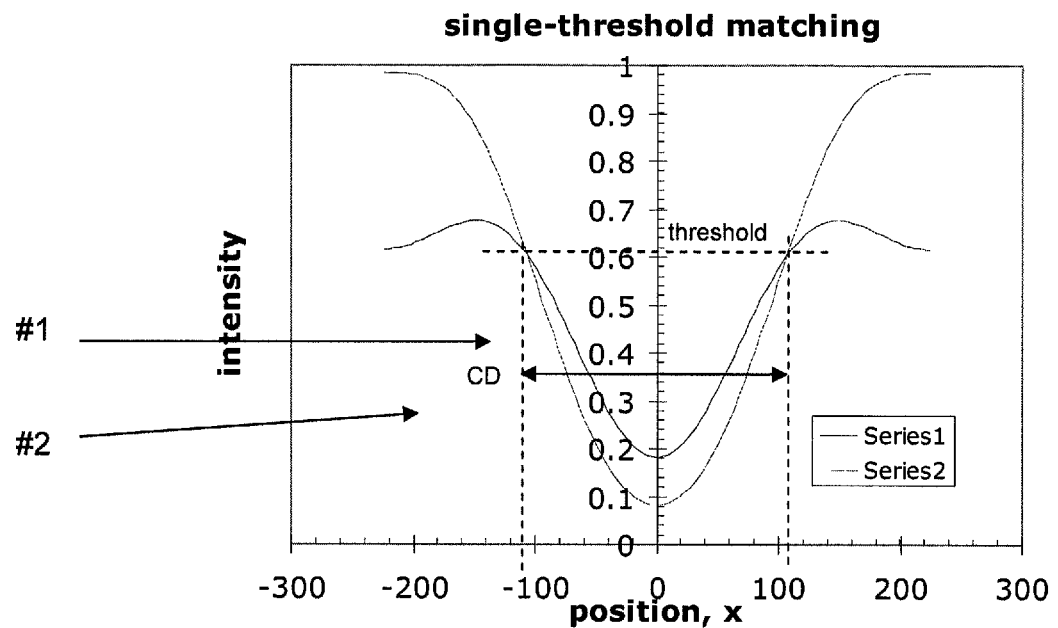
FIG. 2 shows a graph of a single threshold matching method in accordance with an aspect of the invention.

In one contemplated method, as shown in FIG. 2, the present invention can adjust the matching tool to the target tool so that the CD of aerial image #2 matches the CD of aerial image #1. This same methodology can be performed for the resist image. This can be performed by calculating CD by measuring the width of the aerial image at a particular height, called the threshold. It is contemplated that only one threshold can be used, and set CD1=CD2. (See FIG. 2.) As shown in FIG. 2, the aerial image #1 and the aerial image #2 have the same CD at the same threshold (although they do not completely match each other).

Figure 3:
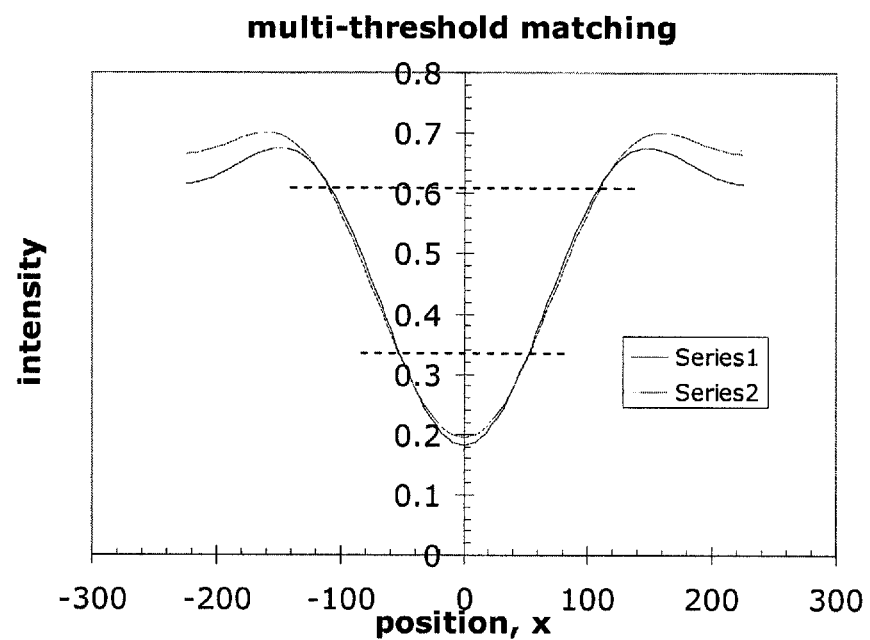
FIG. 3 shows a graph of a multiple threshold matching method in accordance with an aspect of the invention.

In another contemplated method, as shown in FIG. 3, the present invention can use two (or multiple) thresholds. This method forces the images to match in two places. As shown in FIG. 3, this will make the two curves match each other more closely. The invention, then, makes the matching more accurate and robust. In yet another contemplated method, the present invention can adjust the matching tool such that every single point on aerial image #2 matches the corresponding point on aerial image #1. Although this may be a more complicated process, it will provide superior results.

Resist Image Methods

In many cases, the pupilgram and other information from the target tool are not available, because the engineers responsible for the matching tool are not given the information about the target tool. (Those of skill in the art should understand that a pupilgram is a numerical representation of the light intensity in the illuminator pupil plane of the scanner, also called the pupil fill.) In such a situation, the present invention uses resist image methods to calculate resist images. The resist images can be calculated by lithographic modeling software, which requires information about the tool, as well as information about the resist and exposure process. In this embodiment, pupilgram and other information from the target tool are not known; instead, resist CDs of the mask features of interest are provided, which may be experimentally measured at one or more thresholds. The matching tool is then adjusted such that its resist CD output matches the resist CD output of the target tool.

Specifically, in one example, when using the resist image modeling methods, information that may be used to provide the modeling for the present invention can include, for example,
(i) type of resist;
(ii) thickness of resist;
(iii) resist parameters;
(iv) exposure dose;
(v) developing time;
(vi) post exposure bake;
(vii) coatings in the resist stack; and/or
(viii) etch time.

The advantage of the resist-method embodiment is that it is not necessary to know the pupilgram and other detailed information about the target tool, although simple information such as lens NA and illuminator settings should still be provided. Those of skill in the art will recognize that engineers from a scanner manufacturer typically know all the details of their product but few details about the competitor product. The engineers making scanner adjustment should, though, have an accurate resist-exposure model of the process being used by the customer.

In embodiments, the resist CD methods can have the same behavior with respect to thresholds as the modeled-image methods. For example, in the resist CD methods the scanner is adjusted such that the CD of resist image #2 matches the CD of resist image #1. Similar to the aerial image methods, only one threshold can be used, and set CD1=CD2, as shown in FIG. 2. In this example, the aerial image #1 and the aerial image #2 have the same CD at the same threshold (although they do not completely match each other). In another embodiment, as shown, for example, in FIG. 3, two thresholds can be used which forces the images to match in two places. Note that the use of multiple thresholds in the resist method typically requires the customer or user of the target tool also to provide experimental data at multiple thresholds.

Ratio Method

The ratio method is a hybrid method (a combination of the modeled aerial image method and resist CD method), to be used when neither certain information from the target tool nor detailed resist information are available. In the ratio method, CD data is used from both the matching tool and the target tool. In this method, the system of the present invention performs aerial-image modeling and then estimates resist results for the target tool using a ratio of resist CD from the matching tool to aerial-image CD from the matching tool. Those of skill in the art will recognize that this ratio or hybrid method necessarily approximates the complicated behavior of exposed photoresist, and will frequently be the best solution available from the information provided to engineers.

Additional Information

The present invention contemplates the comparison of different tools (scanners) for matching. For example, the target tool can be a scanner manufactured by ASML and the matching tool can be a Nikon scanner to be matched to the ASML tool. Those of skill in the art, though, should recognize that the Nikon tool can be the tool in use and the ASML tool is the tool to be matched with the Nikon tool. Likewise, the present invention contemplates the use of any different tools. Also, the system and methods are described below largely with lens NA (LNA), illuminator NA (INA), and annular ratio (AR) as the parameters to be adjusted on the matching tool. Those of skill in the art will recognize, though, that other adjustments such as stage tilt (e.g., focus drilling), RET ratio and laser bandwidth may also be employed as adjustments.

Exemplary System Environment

The present invention may be embodied as a system, method or computer program product and may, for example, take the form of an entirely hardware embodiment, an entirely software embodiment or an embodiment combining software and hardware. The present invention may also take the form of a computer program product embodied in any tangible storage medium. The present invention can also be implemented as a standalone computer at any site, and may run on a standard personal computer, for example.

The computer-usable or computer-readable (storage) medium may be, for example, an electronic, magnetic, optical, electromagnetic, infrared, or semiconductor system, apparatus, device, or propagation medium. For example, the computer-readable medium may include: a computer diskette, a random access memory (RAM), a read-only memory (ROM), an erasable programmable read-only memory (EPROM or Flash memory), a compact disc read-only memory (CDROM), and/or an optical storage device. The computer-usable or computer-readable medium may contain, store, communicate, propagate, or transport the program for use by or in connection with the instruction execution system, apparatus, or device. The computer program product can be written in any conventional programming language such as, for example, C++ or the like. Also, the computer program product can be compatible with any operating system such as, for example, Windows™ or Linux™ operating systems.

Figure 4:
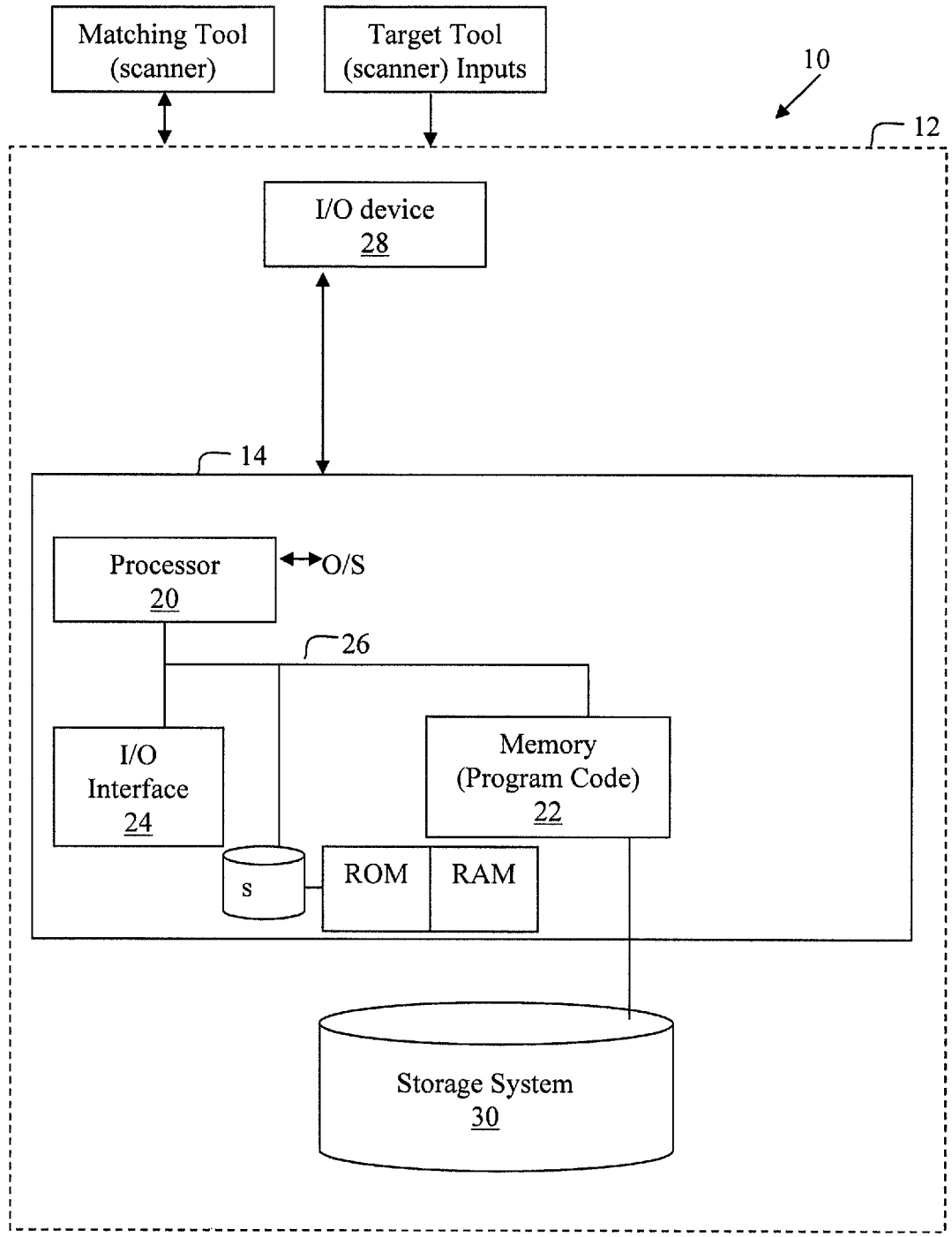
FIG. 4 shows an illustrative environment for implementing the steps in accordance with aspects of the invention.

FIG. 4 shows an illustrative environment 10 for managing the processes in accordance with the invention. To this extent, the environment 10 includes a server 12 that can perform the processes described herein using the computer program code. As should be appreciated by those of skill in the art, the server 12 includes a computing device 14 having one or more processors 20, memory 22, an I/O interface 24, and a bus 26. The memory 22 can include local memory employed during actual execution of the program code, as one non-limiting example. The server 12 and/or computing device 14 can read information input from a target tool and, using this information, match the settings of the matching tool to that of the target tool. In this way, it is possible to provide precise characterization of a lithographic scanner (e.g., matching tool) without having to make the same corrections as already made with the target tool.

The one or more processors 20 may be dedicated processors programmed for execution of particular processes or combination of processes in accordance with the invention, which may be performed on the server 12 and/or the computing device 14. The server 12 and/or computing device 14 may also be dedicated to particular processes or combination of processes in accordance with the invention. As a non-limiting example, the server 12 and/or computing device 14 can be a lithographic modeler, OPE calculator, information reader, pupilgram generator, and/or nonlinear optimizer, amongst other components described with reference to FIG. 5, for example. Accordingly, the computing device 14 and/or server 12 can include any combination of general and/or specific purpose hardware (e.g., one or more processors 20) and/or computer program code. The server 12 and/or computing device 14 can communicate over any type of communications link, such as, for example: wired and/or wireless links; any combination of one or more types of networks (e.g., the Internet, a wide area network, a local area network, a virtual private network, etc.); and/or utilize any combination of transmission techniques and protocols.

The computing device also includes an I/O device 28 that may be external to either the computing device 14 or the server 12. The I/O device 28 can be, for example, any device that enables an individual to interact with the computing device 14, e.g., a display (GUI) of a computing device. In embodiments, the user can enter information into the system by way of the GUI 28. In one example, the input items can be accessible to the user by a dialog box. In addition, it is contemplated that the GUI 28 will lead the user through the input requirements by providing input boxes for textual input or pointer action. Also, the GUI can display the graphs of FIGS. 2 and 3, as well as other pertinent information including, for example, outputs from the modelers, the nonlinear optimizer, etc.

By way of illustration, the GUI 28 can accept scanner and mask information, amongst other information. The scanner information can include, for example, user-defined laser wavelength, laser bandwidth, laser spectrum, immersion and dry exposure data, a default index of refraction (for water), pupil intensity, immersion exposure, threshold information (e.g., low intensity information from pupilgram files), polarization information, etc. Mask information may include, for example, editing capabilities for amplitude and phase information, etc., as well as accepting GDS or OASIS mask files as input to permit the user to select 1-D slices of the 2-D mask to use as OPE matching features. Other information may include, for example, selection of mode (e.g., modeled image, resist CD or ratio method), selection of desired threshold at which to calculate CDs for all aerial images or to use pattern and specified target CD to auto-calculate the threshold for all images, as well as selection of multi threshold or single threshold matching functions.

The server 12 (and/or computing device 14) includes a centralized device repository, e.g., storage system 30. In embodiments, the centralized device repository 30 is configured and/or designed to store the computer code and library information (data) as described below. This allows the system and methods to perform the processes described herein.

Exemplary Architecture

Figure 5:
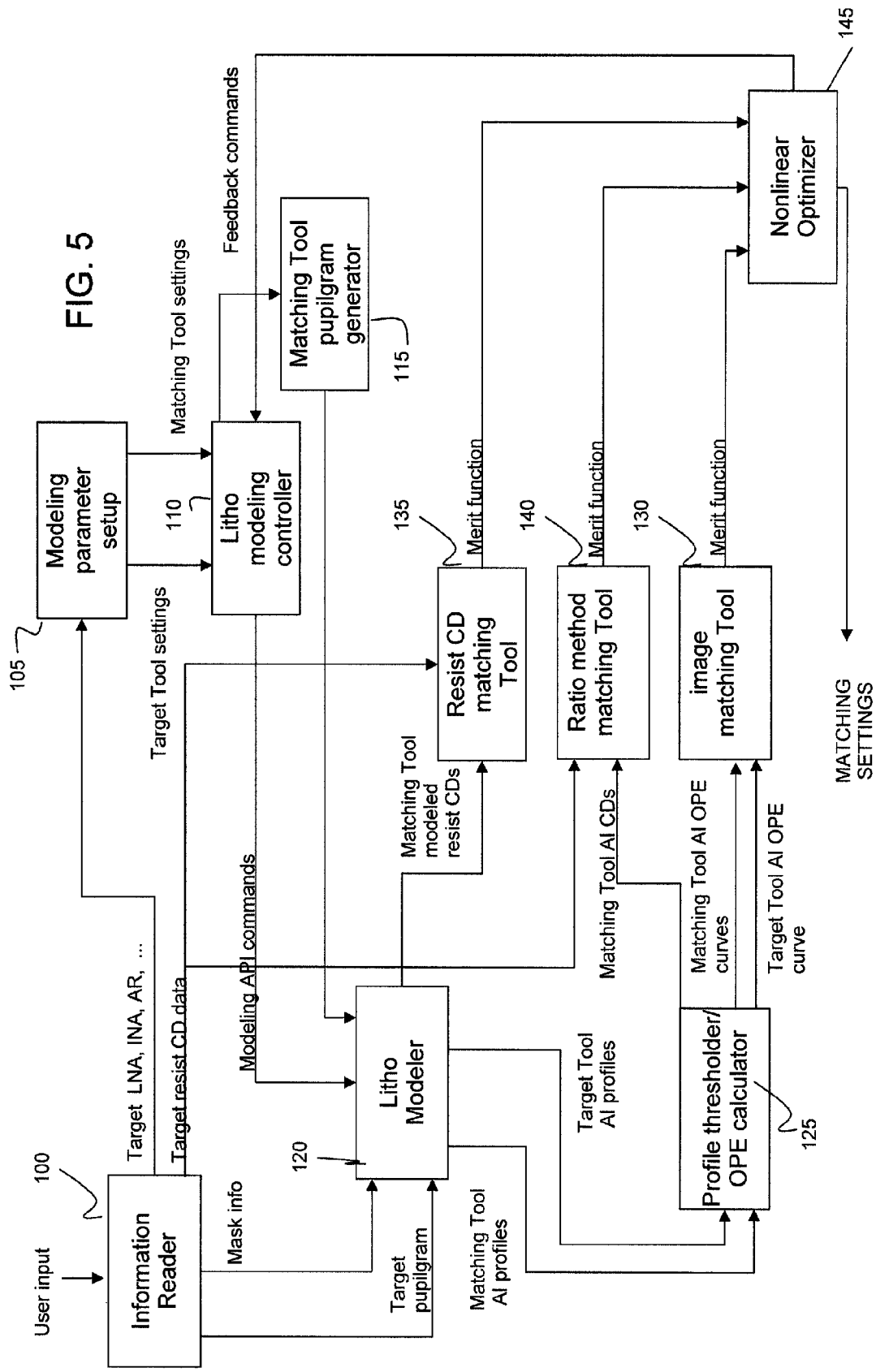
FIG. 5 shows an exemplary architecture in accordance with aspects of the invention.

FIG. 5 shows an exemplary architecture in accordance with aspects of the invention. In particular, FIG. 5 shows several components which implement the processes of the invention. As described above, the several components can each be represented by the environment of FIG. 4, whether that be any combination of general and/or specific purpose hardware (e.g., one or more processors 20) and/or computer program code.

Information Reader

FIG. 5 shows an information reader 100, which obtains information input from a user. The collected information may include masks used in test patterns, as well as target tool settings and resist information. For example, the information may include, more specifically, LNA, INA (or sigma) and AR of the target tool, as well as resist CD data, mask information and pupilgram data. This collected information may be stored, for example, in the storage system 30 of FIG. 4, and provided in an electronic format acceptable to the lithographic modeling tool.

More specifically, the information reader 100 collects relevant information from the user, which is selected based on the desired accuracy and sophistication of the calculation. Relevant information may include, for example:
OPE performance of the competitor tool;
Settings (e.g. LNA, INA, AR) of the competitor tool;
Parameters from the competitor tool such as the pupilgram and lens aberrations;
Resist parameters of the customer process; and
Mask information for the test features.

Relevant information concerning scanner information is detailed in TABLE 1. The information described in TABLE 1 should not be considered an exhaustive list; instead, the listed information is a suggested list of scanner information that may be input into the information reader 100.

TABLE 1

| Input |
|---|
| Lens NA |
| Illuminator sigma |
| Illuminator RET or annular ratio |
| Illumination type (conv., annular, . . . ) |
| For multipole patterns, pole subtended angle. |
| Pupilgram |
| Polarization map of illuminator, if appropriate |
| Lens aberrations, Zernike coef. format |
| Lens aberrations, Jones matrix format |
| Laser center wavelength, nm |
| Laser bandwidth, $E_{95}$ value |
| Laser spectral profile. |
| Chromatic sensitivity |
| Water index of refraction (immersion tools only) |
| Stage x-y synchronization error |
| CDP (Stage tilt) on or off |
| CDP amplitude, if CDP is selected |

In embodiments, the lens aberrations, chromatic sensitivity and stage error may be optional inputs. In embodiments, the remaining information may be required information; however, it should be understood by those of skill in the art that not all of this information may be required. Also, other scanner information may be provided such as, for example, water index of refraction (immersion tools only), focus setting and/or stage tilt settings.

Relevant information concerning customer mask information is detailed in TABLE 2. The information described in TABLE 2 should not be considered an exhaustive list; instead, the listed information is a suggested list of customer mask information that may be input into the information reader 100.

TABLE 2

| Input |
|---|
| Mask type (binary, attPSM, altPSM, chromeless) |
| Drawn CDs |
| Pitch |
| Tone (line or space) |
| Feature number (e.g. should the system look at the first line or the 3rd line in a five-line group) |
| Relative weighting for each feature |

In embodiments, the relative weighting may be optional inputs. In embodiments, the remaining information may be required information; however, it should be understood by those of skill in the art that not all of this information may be required. Also, additional information may include, for example,
A mathematical description of dark and bright areas in mask pattern;
Mask optical transmission and induced phase shift; and
3-D profile of the mask pattern.

Relevant information concerning customer process information is detailed in TABLE 3. The information described in TABLE 3 should not be considered an exhaustive list. Instead, the listed information is a suggested list of customer process information that may be input into the information reader 100.

TABLE 3

| Input |
|---|
| Substrate |
| Thickness of each layer |
| Real and imaginary refractive indices, each layer |
| Resist Dill parameters |
| Other resist parameters TBS |
| Prebake temperature |
| Prebake time |
| Exposure dose |
| Exposure focus setting |
| Post-Exposure Bake temperature |
| PEB time |
| Developer type |
| Development time |

Relevant information concerning customer metrology information is detailed in TABLE 4. The information described in TABLE 4 should not be considered an exhaustive list. Instead, the listed information is a suggested list of customer metrology information that may be input into the information reader 100.

TABLE 4

| Input |
|---|
| Exposed CD for each feature |
| Metrology error |
| Metrology type |
| CD metrology threshold or measurement height |

In embodiments, the metrology error, type and threshold may be optional inputs. In embodiments, the remaining information may be required information.

In embodiments, additional resist and exposure information that may be provided as input includes, for example, the information in the table above as well as:
Etching time; and/or
Composition of etching chemicals.
Modeling Parameter Setup Tool The modeling parameter setup tool 105, based on the target tool settings, decides what range of settings should be modeled on the matching tool. This can be a set of settings (e.g., knob adjustments) which are the same as that of the target tool, or a range of settings of the matching tool based on the LNA, INA and AR information provided to the modeling parameter setup tool 105.

More specifically, the modeling parameter setup tool 105 reads the initial settings of the target tool and sets a range of settings on the matching tool that is sufficient to encompass a matching tool setting that will match the target tool. In embodiments, ideally, the modeling parameter setup tool 105 would not employ the matching tool settings that are out of the range of the matching tool lens or illuminator settings.

As an example, suppose that the target tool exposures were made at a lens NA of 1.2. The library modeling setup would select lens NA values for the matching tool that would reasonably be expected to be within range of the true matching settings, e.g., it could perform calculations from NA 1.0 to 1.3. As another example, LNA can be varied over a range from 1.06 to 1.14, where the initial reference setting was 1.10. The CDs from the matching tool can then be calculated at a variety of intermediate LNA settings, and the response of CD change with respect to LNA change can then be calculated.

By way of further example, TABLE 5 shows non-limiting exemplary numerical requirements for a matching tool. In addition to the numerical setting below, it is also contemplated to include, for example, bandwidth range and stage-tilt range.

TABLE 5

| Parameter | Requirement |
| --- | --- |
| LNA range | Initial setting ±0.05, not to exceed Nikon scanner limit. |
| INA range | Initial setting ±0.05, not to exceed Nikon scanner limit. |
| AR range | Initial setting ±0.05, not to exceed Nikon scanner limit. |
| LNA, INA, AR step size | 0.01 |

Lithographic Modeling Controller

The settings of the target tool are provided to a lithographic modeling controller 110. The lithographic modeling controller 110 commands repeated runs of a lithographic modeler 120 as a function of the parameter settings (e.g., repeated runs at different LNA, INA, and AR settings). The repeated runs can amount to, for example, in excess of 200 runs, in one embodiment.

More specifically, the lithographic modeling controller 110 will accept modeling parameters from the modeling parameter setup tool 105 as well as the information reader 100, and sets-up lithographic modeling runs. Information that may be required for each individual modeling run is provided in TABLE 5, above. In addition, the lithographic modeling controller 110 can be directed to start runs both at the beginning of the analysis and as commanded during search of the matching tool response space.

The lithographic modeling controller 110 can also provide a log file containing all the information listed in TABLE 6, below, for each modeling run, as well as the time and date at which the modeling run was executed. This information can be stored in the storage system 30 of FIG. 4. In additional embodiments, other scanner and resist process information can be provided to the library and stored in the storage system 30. The lithographic modeling controller 110 can calculate a library of aerial image profiles or resist CDs by accepting a multiplicity of tool settings and repeatedly running calculations at those settings.

TABLE 6

| Parameter | Requirement |
| --- | --- |
| Mask information | Mask type (binary, attPSM, etc.) Area to be modeled Light and dark areas Feature tonality (line or space) |

TABLE 6-continued

| Parameter | Requirement |
| --- | --- |
| | Coordinates for start and end of slice to be modeled. Feature number (e.g. should the system look at the first line or the 3rd line in a five-line group) |
| Lens information | Lens NA Magnification Aberration set |
| Illuminator information | Illumination wavelength Illuminator settings (INA, AR, type) Illumination pupilgram from competitor scanner or from Nikon pupilgram generator. |

In addition, the lithographic modeling controller 110 can command the lithographic modeler 120 to execute either modeling of 1-D features or user-selected 1-D slices of 2-D features. The commands issued should preferably conform to the API requirements of the lithographic modeler 120. The lithographic modeling controller 110 can also provide a log file of output containing the information fed back from the lithographic modeler 120. The log files can be stored in the storage system 30 shown in FIG. 4.

Matching Tool Pupilgram Generator

The modeled settings of the matching tool are sent from the modeling parameter set up tool 105 to a matching tool pupilgram generator 115. The modeling parameter set up tool 105 emulates a pupilgram from the matching tool at each different LNA, INA, and AR combination. Alternatively, the pupilgram generator can operate with input parameters sigma=INA/LNA and by specifying an inner and outer INA or sigma. This can be performed by equations which describe the behavior of optical elements in the illuminator to make a faithful prediction of the intensity output of the illuminator, and then create an electronic numerical representation of that output, for example via a table of intensity values. This pupilgram information is provided to the lithographic modeler 120 to calculate aerial-image profiles or resist CDs based on scanner setting, pupilgram, and other scanner information, as well as appropriate resist parameters.

More specifically, the matching tool pupilgram generator 115 accepts settings for LNA, INA or sigma and AR and illumination type (conventional, annular, etc.) and can calculate a pupilgram or intensity map that is an accurate representation of pupilgram from an actual matching tool. For some settings, additional information may be required, such as the subtended angle or placement angle of poles in multipole-type partial coherence settings. Those of skill in the art will recognize that the pupilgram generator should preferably encompass all settings relevant to the pattern being generated. The outputs can be pixelated array of intensity values indexed by partial coherence sigma (compared to INA). The pupilgrams can be generated for all matching tool systems as described herein.

Lithographic Modeler

The lithographic modeler 120 can be any commercially available modeler such as, for example, Prolith, made by KLA-Tencor, S-Litho, made by Synopsys, or HyperLith, made by Panoramic Technologies. In embodiments, the lithographic modeler 120 can accept commands from the lithographic modeling controller 110 and pupilgram generator 115 in order to execute modeling of the selected mask under the conditions specified in the input, and return the result to a profile threshold OPE calculator 125 and/or a resist CD matching tool. The lithographic modeler 120 can operate completely as a module contained within the matching tool, for example, without modeling software GUI. The output of the lithographic modeler 120 can include, for example, calculated or experimental OPE curves at nominal tool settings and at the matching settings, as well as predicted CD-Focus curve comparison, predicted Bossung curve, CD-Dose curve comparison and Mask Error Enhancement Factor (MEEF) comparison.

The lithographic modeler 120 can include as usable input all the scanner information parameters listed in TABLE 1. In addition, the lithographic modeler 120 can calculate (if selected) (i) one-dimensional (1-D) and two-dimensional (2-D) aerial-image profiles in air, (ii) 1-D and 2-D aerial-image profiles in unexposed resist, with resist parameters specified by the user, and/or (iii) 1-D and 2-D profiles in exposed resist, with resist parameters and dose specified by the user. In one example, the method of nonlinear least-square fitting can be used to fit a fifth-order polynomial curve to a set of (x,y) values describing a one-dimensional aerial image. The test features can be provided as .gds file inputs.

Also, the lithographic modeler 120 can employ a vectorial aerial image model, as well as employ and allow selection of first-principle, (e.g. "Mack type") and lumped-parameter resist models. Vector modeling includes knowledge of the behavior of the imaging dependent on the intensity and polarization state of the light; whereas, scalar modeling includes only the intensity information. A first-principle resist model can also be implemented with the invention, which uses equations that describe the chemical processes in exposure and development of resist. Lumped-parameter or similar models can also be used; as should be understood by those of skill in the art, a lumped-parameter resist model describes only phenomenological behavior of the resist with no understanding of the chemical processes. The lithographic modeler 120 can also allow the lithographic modeling controller 110 to command composite profiles calculated as a result of laser bandwidth, with supplied lens chromatic aberration sensitivity.

The lithographic modeler 120 can calculate aerial image using a mathematical representation of the light intensity and phase emanating from the mask and applying to it mathematical functions describing the behavior of the projection lens and the illuminator of a lithographic tool as well as the wavelength information of the light impinging on the mask. Typically, all the optics are represented by Fourier optics techniques. For instance, the effect of lens NA is included by a Fourier transform to the pupil plane of the lens, filtering the transform, and a reverse Fourier transform to the image plane of the lens. The result is a mathematical representation of the light intensity and phase at the lens image plane.

The lithographic modeler 120 can also calculate resist models by taking the aerial image calculation as input, as well as information concerning the thicknesses, chemical properties, and optical properties of the resist and other layers applied to a wafer. The lithographic modeler 120 performs a mathematical calculation of the effect of chemical changes in the resist caused by the light and then further changes induced by heating, developing, and etching the resist.

TABLE 7 shows the output parameters from each run of the lithographic modeler 120, commanded by the lithographic modeling controller 110. These outputs can be recorded in a text-format log file such as, for example, the storage system 30 shown in FIG. 4.

TABLE 7

| Parameter | Requirement |
| --- | --- |
| Starting information | All parameters from previous table. |
| Aerial image profile | Aerial image intensity recorded as I(x) vs coord, x. |
| Resist profile | similar. |

Profile Threshold OPE Calculator

Aerial image profiles of the matching tool and target tool are provided to the profile threshold OPE calculator 125. The profile threshold OPE calculator 125 calculates CDs from aerial-image profiles of the matching tool and target tool.

More specifically, the profile threshold OPE calculator 125 accepts aerial-image profiles from the lithographic modeler 120, e.g., threshold one specified reference profile, and uses the threshold to calculate aerial-image CDs for all other profiles. In optional embodiments, the profile threshold OPE calculator 125 allows for multiple thresholds per profile and calculates two or more CDs per profile. In still other optional embodiments, the profile threshold OPE calculator 125 will allow for another characterization of the aerial image profile such as, for example, edge slope, correlation with peak function, corner radii, etc.

In one example, the profile threshold OPE calculator 125 calculates CD by measuring the width of the aerial image at a particular height. Illustratively, the CD calculation can be performed as follows:

Collect a set of (x,y) points describing the aerial image profile, where x is position and y is intensity;

Fit a mathematical curve to the points, e.g. by using a polynomial fit or a spline interpolation;

Solve the resulting curve equation to find two x points on the curve where the intensity value is equal to the height; and CD is given by the difference between the x values of the two aforementioned points.

Those of skill in the art should realize that aerial-image CD through pitch, via thresholding aerial-image profiles, can be calculated to a series of aerial-image profiles obtained from masks with different pitches. (Behavior of CDs through pitch is controlled by the Optical Proximity Effect (OPE).) Similarly, CD in resist can be calculated by applying a process similar to the process noted above to a resist profile obtained from calculation or experimental measurement.

The profile threshold OPE calculator 125 can also find a threshold or multiple thresholds to calculate a reference CD and apply that threshold to calculate CDs for all other profiles in an OPE curve. For example, From a set of masks of different pitches, select the one pitch that is desired to be used as the reference;

For that one mask, select the desired reference CD. For a 90-nm feature, for example, this might be 90 nm;

Calculate the aerial image or resist image of that reference mask under appropriate exposure conditions;

Use the method above for CD calculation at a multiplicity of threshold values to obtain a set of (x,y) number pairs describing CD as a function of threshold for that one profile;

Fit a function to that set of points;

Solve the equation of that function to obtain the threshold value that yields the desired reference CD; and Apply that master threshold to all other aerial-image profiles, using the method above for CD calculation, to calculate CDs for all other masks under the same exposure conditions.

As an example, masks can be created (in modeling) at CD values of 70 nm, 80 nm, and 90 nm, and at 20 different pitches ranging from 140 nm to 700 nm. The masks are 6% attenuating phase-shift one-dimensional spaces. Aerial-image profiles can then be calculated for each mask. The feature with 90 nm mask CD and 380 nm pitch can be selected as the reference feature. A threshold is then calculated such that the aerial image has a CD of 90 nm at that threshold. That threshold is then applied to all the other aerial-image profiles to calculate a CD in the aerial image for each mask.

Modeled Image Matching Tool

The modeled image matching tool 130 (also referred to in an image matching tool) receives as input aerial or resist images and uses this information to quantify the degree to which the images are similar. One example would be to use two threshold values (1 and 2) and apply them to both images A and B, calculating four CD values (CDA1, CDA2, CDB1, CDB2) using the method above for CD calculation. The image matching tool 130 could calculate a net CD difference $((CDA1-CDB1)^2 - (CDA2-CDB2)^2)^2$. As should be understood, smaller CD differences are more closely matched images.

More specifically, the image matching tool 130 uses CDs or other information and constructs a merit function to be optimized. In embodiments, the merit function describes the degree to which a calculated parameter matches a desired value. For example, frequently a merit function is set up to describe a difference and has an ideal value of zero. In one non-limiting example, the merit function can be represented as:

$$M_s = \left( \sum_p (C_p^T - C_{p,s}^M)^2 \right)^{1/2}$$

where p indicates pitch, index s indicates scanner setting, $C_p^T$ is the target tool CD at pitch p at the reference setting s and $C_{p,s}^M$ is the corresponding matching tool CD at pitch p and setting s. Note that the use of CD is non-limiting, i.e., the quantity C can also refer to another characterization of the image such as, for example, edge slope, corner radii, etc. The merit function can be evaluated at each matching tool setting s and minimized to find the setting s that yields the best match. The image matching tool 130 is also capable of setting a series of weights to individual pitches during the calculation of the merit. The weight is useful when a user wants to reduce CD difference at one or more specific pitches.

Accordingly, the image matching tool 130 employs aerial image modeling in order to compare modeled aerial image from the matching tool to modeled aerial image from the target tool. The image matching tool 130 uses the information from the profile thresholder OPE calculator 125 (e.g., aerial image OPE-curve information from the target and matching tool) to construct a merit function describing the match between matching OPE and the target OPE curve, at different matching tool settings. The image matching tool 130 is also configured to allow for use of single or multiple CDs calculated for each profile, or for other characteristic profile metrics, in addition to allowing for user-defined weighting of profile metrics.

Resist CD Matching Tool

The resist CD matching tool 135 uses resist CD information to construct a merit function to be optimized. As an example, the resist CD matching tool 135 would use resist images to quantify the degree to which the images are similar (similar to the example described with respect to the image matching tool 130).

More specifically, the resist CD matching tool 135 employs calibrated exposed-resist modeling to compare modeled resist CD from the matching tool to experimental resist CD from the target tool. The resist CD matching tool 135 can also employ measured resist CD (or other characteristic) from the matching tool to calibrate and correct modeled resist CD empirically. Optionally, the resist CD matching tool 135 can allow for another characterization of the printed image such as, for example, edge slope, corner radii, etc. As described above, the resist CD matching tool 135 will construct a merit function describing the match between matching tool OPE and the target tool OPE curve, at different matching tool settings. The CD matching tool 135 can also employ a series of weights in the merit function, similar as described above with regard to the image matching tool 130. In addition, the resist CD matching tool 135 (or other computing device) can apply known algorithms for smoothing and reducing standing-wave effects in resist images.

Ratio Method Matching Tool

The ratio method matching tool 140 constructs a merit function based on a hybrid of resist and aerial-image information. For example, the ratio method matching tool 140 calculates a CD ratio from the matching tool OPE data and the matching tool OPE modeling, and then uses that ratio to calculate the merit function based on competitor resist CDs.

More specifically, the ratio method matching tool 140 employs aerial image modeling in order to compare modeled aerial image CD from the matching tool to experimental resist CD from the matching tool and calculates a pitch-dependent ratio $$r_p = \frac{CD_p^{SEM}}{CD_p^A}.$$

where $CD_p^{SEM}$ represents the measured resist CD at pitch p and $CD_p^A$ represents an aerial-image CD at the same pitch p. The ratio method matching tool 140 also estimates a "target" aerial image CD for the target tool by dividing the target tool resist CDs at pitch p by the corresponding ratio $r_p$. For example, the dividing is a calculation of virtual aerial image CD of the target tool. More straightforward, it is possible to estimate the resist CD of the matching tool by multiplying $r_p$ to the modeled aerial image DC of the matching tool. The ratio method matching tool 140 will also construct a merit function describing the match between matching tool aerial-image OPE and the target tool estimated aerial-image OPE curve, at different matching tool settings. The ratio method matching tool 145 can also employ a series of weights in the merit function, similar as described above with regard to the image matching tool 130 and CD matching tool 135.

Nonlinear Optimizer

The nonlinear optimizer 145 uses the merit function from the selected matching tools (e.g., aerial image matching tool, ratio method matching tool or resist CD matching tool) to vary the matching tool adjustments and calculate a matching setting. Optionally the nonlinear optimizer 145 commands new modeling runs during the search for minimizing the merit function. The output of the nonlinear optimizer 145 includes, for example, the recommended values of matching tool settings such as, for example, LNA, INA, AR, etc. Additionally, the output from the nonlinear optimizer may include a range of recommended adjustment range about the match to allow for fine tuning.

More specifically, the nonlinear optimizer 145 analyzes the merit function from one of the three matching tools as a function of matching tool setting. The nonlinear optimizer 145 can optimize the merit function by nonlinear methods such as spline interpolation, method of steepest descents, Gauss-Newton algorithm, Levenberg-Marquardt algorithm, etc.

In a basic setting, the nonlinear optimizer 145 can use a constructed library of the merit function as calculated at all available matching tool settings. In a more advanced setting, the nonlinear optimizer 145 can analyze the merit function and feedback commands to the lithographic modeler 120 in order to construct the merit function in real time (e.g., on the fly), eliminating the need for the library.

In one non-limiting example, the nonlinear optimizer 145 uses the merit function to vary the matching tool adjustments and calculates a matching setting by using the matching tool adjustments as the input parameters to a response function describing the output of the matching tool. The nonlinear optimizer 145 then enters the response function output into the merit function and finds values of the matching tool adjustments that minimize the merit function, thereby minimizing the difference between the matching tool and the target tool.

As a more specific example, the nonlinear optimizer 145 takes as its input the behavior of a system that is described by a set of adjustable parameters in a nonlinear response function. For instance, a response function $r=Ax+Bx^2$ is linear in the parameters A and B (compared to a response function $r=A(\sin Bx)$ which is not linear). The nonlinear optimizer 145 can use both types of function. With the response function known, the nonlinear optimizer 145 will vary the input parameters (A, B, etc.) to arrive at the optimum value of the input parameters, or the values that yield the closest match to some desired value. Often the response is combined with a merit function. The nonlinear optimizer 145 uses mathematical techniques to explore different settings of the parameters and efficiently arrive at the "best" setting. Advantageously, the nonlinear optimizer 145 does not need to try all possible settings of the parameters.

A specific, non-limiting example, of using information together with a nonlinear matching core algorithm to calculate a matching tool setting that will match the target tool performance may include:
  Collect a set of aerial-image CDs from the target tool;
  Calculate CDs from the matching tool at the same settings (typically lens NA, illuminator NA, and annular ratio);
  Evaluate the merit function at these setting;
  Mathematically evaluate performance of the matching tool at a multiplicity of settings; and
  Progressively evaluate performance at each setting and then pick a new setting based on the results, automatically proceeding toward the setting which minimizes the difference between the CDs from the matching tool and the CDs from the target tool.

The matching tool behavior can be verified to correspond to the target tool behavior when certain parameters, such as focus and dose, are adjusted. This can be accomplished by comparing the predicted matching tool and target tool aerial-image or resist-image output, typically via CD calculation, and applying the merit function to both sets of output.

Exemplary Processes

FIGS. 6-11 illustrate exemplary processes in accordance with the present invention. The steps of FIGS. 6-11 may be implemented on the computer infrastructure of FIG. 4 and/or the architecture of FIG. 5, for example. The flow diagrams in FIGS. 6-11 may be illustrative of the architecture, methods and computer program products according to various embodiments of the present invention. In some implementations, the functions noted in the blocks may occur out of the order. Each block of the flow diagrams and combinations of the flow diagrams can be implemented by special purpose hardware-based systems as described above, and will be described generally as a "program control" performing the functions thereof. It should be noted, though, that the terminology "program control" is generic terminology which may refer to any hardware, system, program code, etc. performing the functions as described herein. For the purposes of this description, a computer-usable or computer readable medium can be any apparatus that can contain, store, communicate, propagate, or transport the program for use by or in connection with the instruction execution system, apparatus, or device as described above.

Generally, the process includes running a lithographic model for the target tool and running the model on the matching tool for a plurality of different settings (e.g., 200 or more) using, e.g., lens numerical aperture (LNA), numerical aperture (NA) of the illuminator and annular ratio (AR) of the pattern which is produced by the illuminator. The process then selects the setting on the matching tool that most closely matches the output of the target tool.

Exemplary Processes of the Invention

Figure 6:
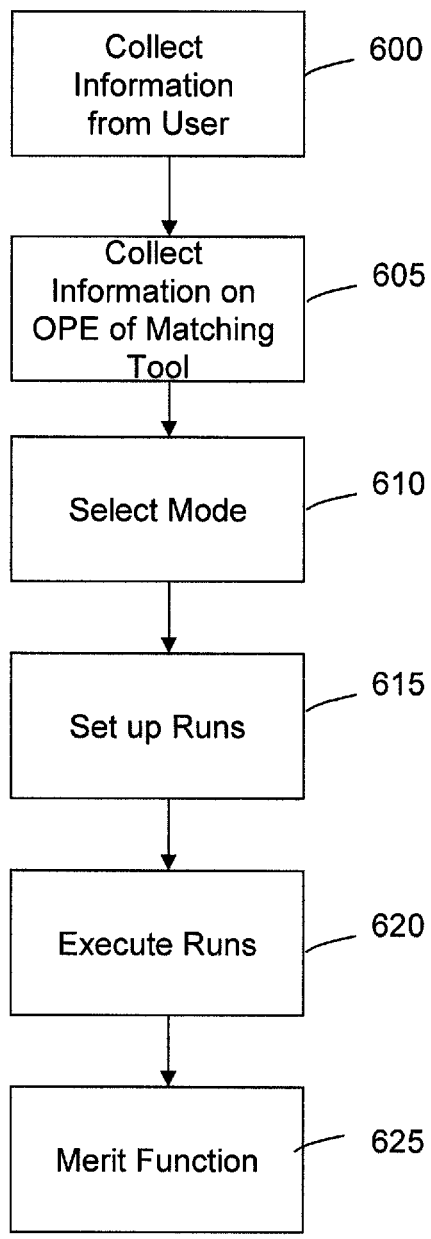
FIG. 6 shows a high level process flow in accordance with aspects of the invention.

FIG. 6 shows a process flow in accordance with aspects of the invention. In particular, at step 600, the program control collects information from the user about the target tool related to the OPE performance (OPE curve) as well as its settings. The OPE curve (CD measurements) using customer masks on the tool already in use can be obtained from an experimental exposure of mask features at different pitches. This information can also include, for example, mask information, as well as the information noted above with respect to the inputs to the information reader 100. As step 605, the program control collects information about OPE performance of the matching tool. At step 610, the program control selects a mode of operation. The selection of the mode of operation can also be selected manually.

In embodiments, the selection of the mode is dependent on the information gathered, and can include, for example, modeled image mode, resist CD mode, or ratio mode. The criteria for mode selection can be based on the information provided in TABLE 8, for example.

TABLE 8

| MODE | INFORMATION |
| --- | --- |
| Modeled Image Method | Description of features used in exposure test; LNA and illuminator settings on target tool; pupilgram from target tool; other data from target tool such as, lens aberrations, chromatic sensitivity, and/or laser bandwidth. |
| Resist Method | Description of features used in exposure test; LNA and illuminator settings on target tool; resist CD data from target tool; calibrated resist model for process being used. |
| Ratio Method | Description of features used in exposure test; LNA and illuminator settings on target tool; resist CD data from target tool. |

At step 615, the program control sets up collection of internal lithographic modeling runs to predict matching tool performance at a variety of different tool parameter settings.

For instance the program control may model the matching tool at different LNA, NA and AR settings. At step 620, the program control executes the collection of modeling runs, which can be performed repeatedly. At step 625, for each modeling run, the program control evaluates the merit function describing the difference in the matching tool and the target tool performance.

The program control uses this information together with a nonlinear matching optimizer to calculate the settings of the matching tool to match the target tool performance as closely as possible. For example, the nonlinear optimization may search the matching tool modeling response surface as a function of the control parameters and find a response that minimizes the merit function, e.g., as close to zero as possible. That is, the nonlinear optimization can calculate the response of the matching tool to changes in LNA, INA, AR, or other settings.

Figure 7:
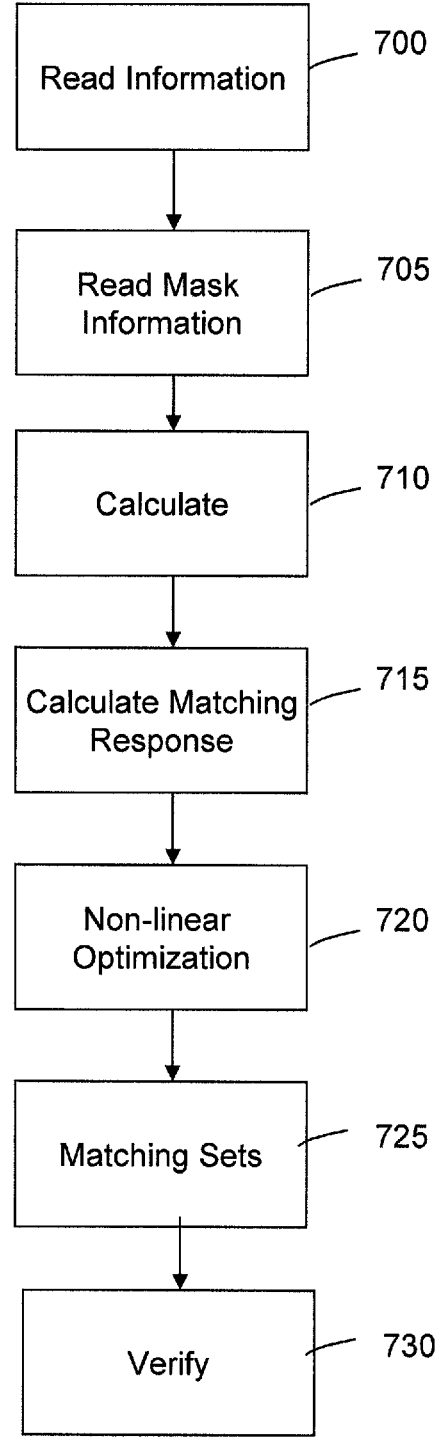
FIG. 7 shows a high level process in accordance with aspects of the invention.

FIG. 7 shows a process in accordance with aspects of the invention. More particularly, at step 700, the program control reads the target tool pupilgram file or customer resist information. A target tool pupilgram file is an electronic version of the numerical representation, obtained either by experimental measurement or by calculation. At step 705, the program control reads mask information for customer test patterns and selects a matching type (e.g., aerial image or resist or ratio modeling). At step 710, the program control calculates CD through pitch, via thresholding aerial-image profiles, or calculates CD in resist, for example. At step 715, the program control calculates matching tool response to adjustments such as LNA, INA, AR, stage tilting, and dose, amongst other options noted herein If needed, for speed reasons, a loop back to run lithographic modeling as the merit function is evaluated can be employed.

At step 720, the program control uses nonlinear optimization to match the matching tool to the target tool using the adjustments. At step 725, the program control supplies the "matching set" of "X" number of adjustments. At step 730, the program control verifies that the matching tool behavior corresponds to the target tool behavior when certain parameters, such as focus and dose, are adjusted. In this way, the program control provides process window optimization of the matching tool.

Those of skill should understand that process window generally refers to the variation in focus and dose that can be applied to printing images in resist and still obtain results of acceptable quality. The window size is roughly equivalent to the product of the focus variation and the dose variation. It is naturally desired to have as much tolerable variation in focus and dose as possible, i.e., to have a large window. Optimization refers to performing small adjustments on the tool to make this window as large as possible within situational constraints.

Modeled Image method

Figure 8:
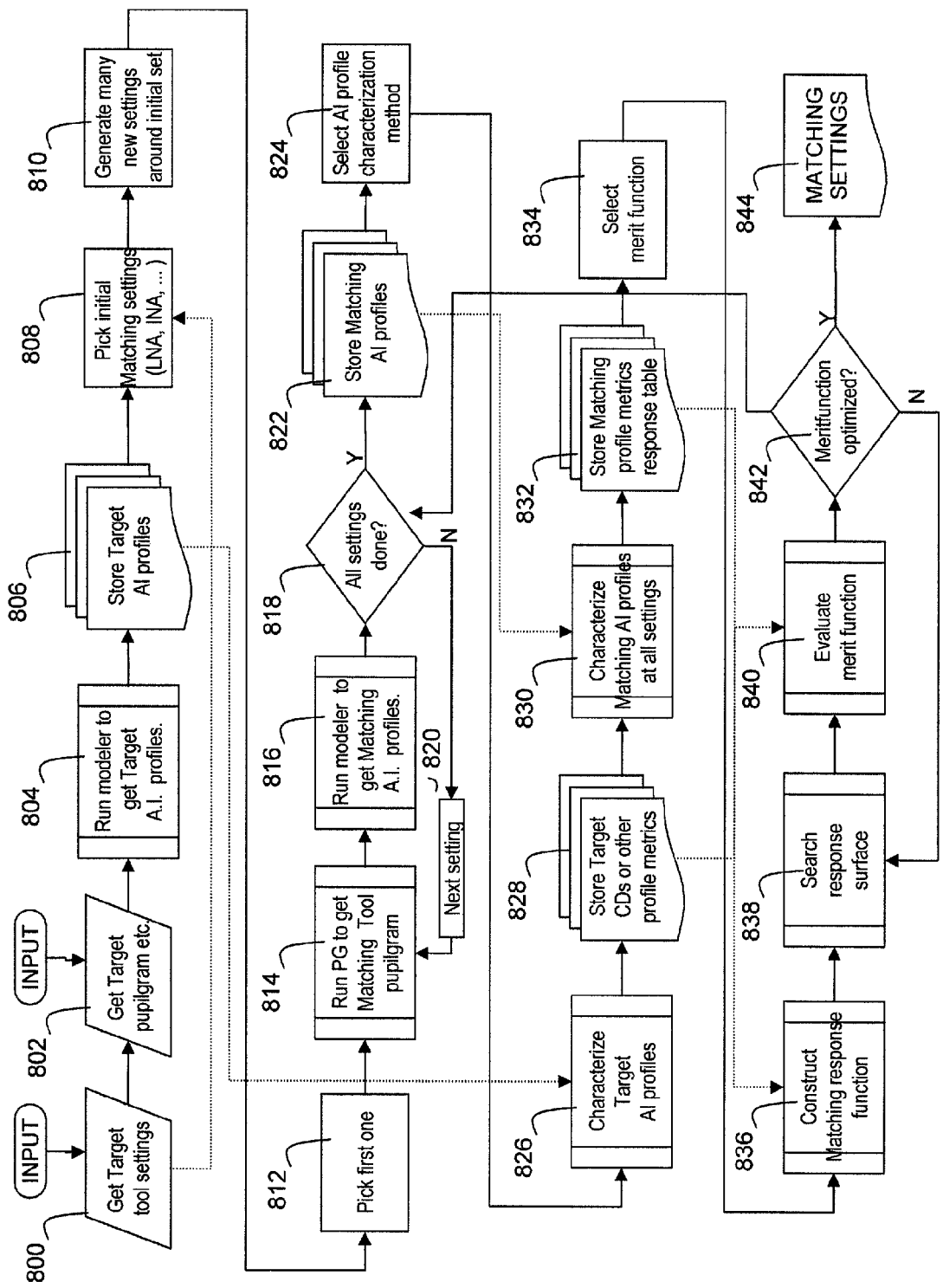
FIG. 8 shows a process flow for aerial image OPE matching in accordance with an aspect of the invention.

FIG. 8 shows a process flow for the modeled image method in accordance with an aspect of the invention, wherein modeled aerial or resist images from the target tool will be compared to modeled aerial or resist images from the matching tool. While the figure refers to "A.I." meaning aerial images, it is to be understood that the method can be performed equivalently using resist information and resist image calculations. At step 800, the target tool settings are obtained (input) from the user (customer). The target tool settings can be stored in a database (e.g., storage system 30). At step 802, the pupilgram and other information noted above are input (obtained) for future use. At step 804, the program control runs a lithographic modeler to obtain aerial image or resist image profiles of the target tool. At step 806, the program control saves the aerial image or resist image profiles of the target tool in a library, e.g., database. At step 808, the program control selects initial settings for the matching tool, for example, of LNA, INA and AR. At step 810, the program control generates many new settings around the initial settings. This can be performed, for example, by the lithographic modeling controller.

At step 812, the program control selects one of the settings of the matching tool. At step 814, the program control obtains a pupilgram of the matching tool. In embodiments, the pupilgram can be obtained by the matching tool pupilgram generator. At step 816, the program control obtains aerial image or resist image profiles of the matching tool. In embodiments, the aerial image profiles or resist image can be obtained by the lithographic modeler. At step 818, a determination is made as to whether all of the settings have been used to generate a pupilgram and image profiles. If not, then the process reverts to step 814 by first selecting the next setting at step 820.

Those of skill in the art should appreciate that the decision of step 818 may also be based on a predetermined amount of settings or other criteria. For example, the other criteria may include, by way of illustration, a threshold value (low or high value), a time constraint for evaluation, a practicality constraint if the solution may be difficult to determine. In any of these embodiments, if the predetermined amount of settings, etc., have not been selected, then the process reverts to step 814 by first selecting the next setting at step 820.

In any of the embodiments, after the set amount of settings are selected and used to generate the pupilgram and aerial image profiles, the process will continue to step 822. At step 822, the aerial images or resist images of the matching tool are stored in a database, for example. At step 824, the program control selects an aerial image profile characterization method. For example, the program control can characterize the image profile by use of a single or multiple CD calculation for each profile, or for other characteristic profile metrics described above. It is also possible to have user defined weighting of the metrics, at this processing stage.

At step 826, the program control will characterize (e.g., evaluate) the aerial image or resist image profiles of the target tool. This processing step can also be performed after the images are stored in a library at step 808. At step 828, the CDs or other profile metrics of the target tool are stored in the database. At step 830, the images of the target tool for the settings are characterized and, at step 832, the profile metric response table of the matching tool is stored in the database. Step 830 can follow directly from step 822. At step 834, the program control selects a merit function such as, for example, $$M_s = \left(\sum_p (C_p^T - C_{p,s}^M)^2\right)^{1/2}.$$

At step 836, the program control constructs a response function of the matching tool. For example, in embodiments, the nonlinear optimizer will calculate the responses of the matching tool based on the adjustments made to the matching tool. In this way, the nonlinear optimizer can determine a response of the matching tool over many different adjustments. At step 838, the program control will search the response surface for the settings. As noted above, the setting may be all of the settings or a predetermined amount of settings, which are used to describe the response surface.

At step 840, the program control evaluates the merit function. That is, the program control uses the response surface generated for the matching tool and compares the response to the target tool in order to calculate the merit function. At step 842, the program control determines whether the merit function is optimized. For example, the program control determines if the merit function is zero, close to zero or at a predetermined value. The smallest difference between the matching tool and the target tool is optimal/desirable. If the merit function is not optimized, the process will revert to step 818. Once the merit function is optimized, the process will end at step 844, at which time the target tool and the matching tool will have matching settings (substantially matching settings or settings that meet a predetermined threshold match).

In embodiments, if the merit function cannot be optimized, the program control can notify the user of such instance. In the cases where all of the settings are not selected at step 818, the program control can select additional settings in order to perform the subsequent processes in order to optimize the merit function. In embodiments, the program control can determine addition settings that may perform closely to the target tool performance through interpolation or extrapolation methods.

Resist CD Method

Figure 9:
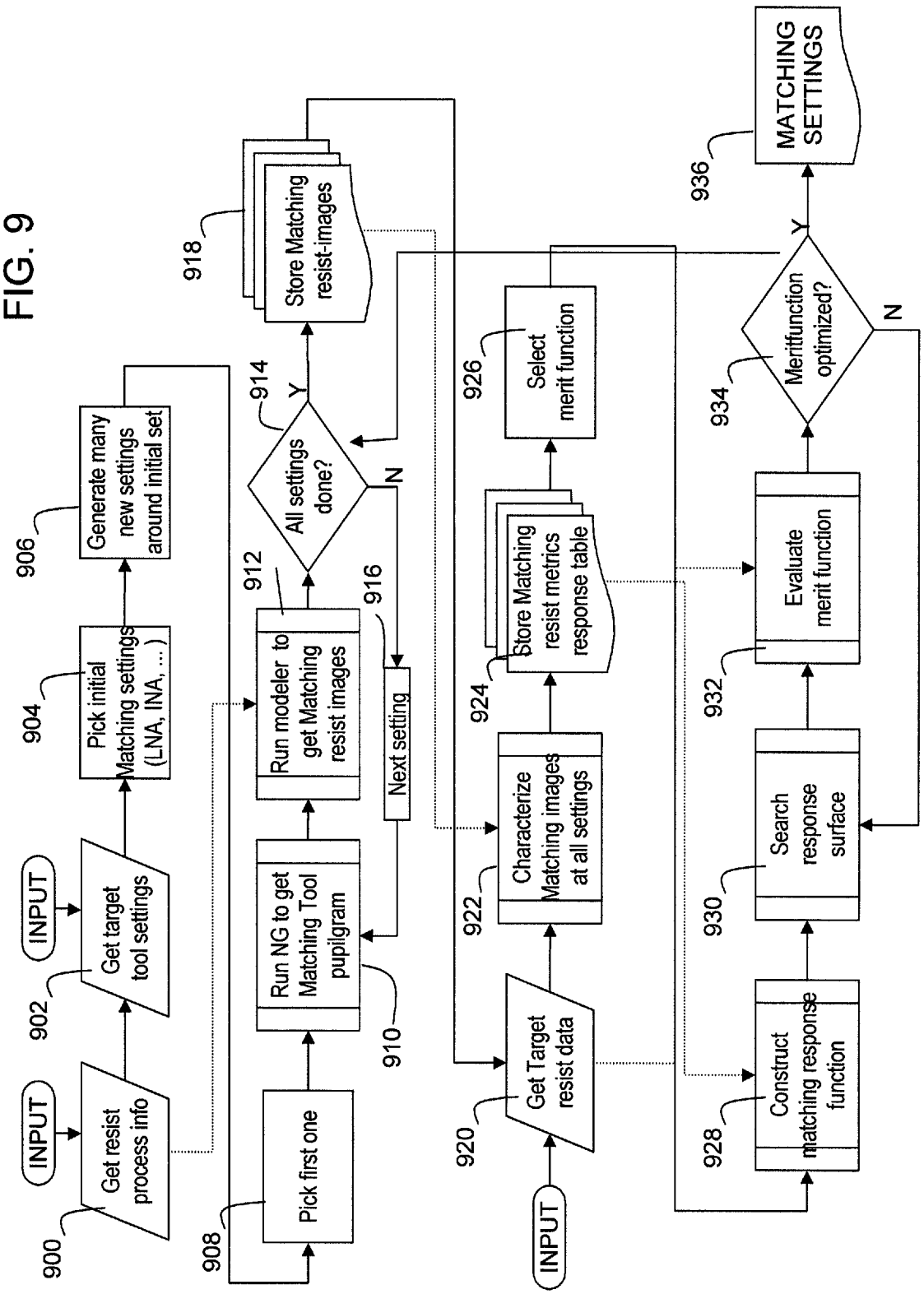
FIG. 9 shows a process flow for resist image OPE matching in accordance with an aspect of the invention.

FIG. 9 shows a process flow for resist image modeling in accordance with an aspect of the invention, wherein modeled resist images from the matching tool will be compared to resist data from the target tool resist. At step 900, the target tool resist process information is obtained (input) from the user (customer). The target tool resist process information can be stored in a database. At step 902, the tool settings of the target tool are obtained, which may also be stored in a database. At step 906, the program control selects initial settings for the matching tool, for example, LNA, INA and AR. At step 906, the program control generates many new settings around the initial settings. This can be performed, for example, by the lithographic modeling controller.

At step 908, the program control selects one of the settings of the matching tool. At step 910, the program control obtains a pupilgram of the matching tool based on the settings. In embodiments, the pupilgram can be obtained by the matching tool pupilgram generator. At step 912, the program control obtains resist images of the matching tool. In embodiments, the resist images can be obtained by the lithographic modeler. At step 914, a determination is made as to whether all of the settings have been used to generate a pupilgram and resist images. If not, then the process reverts to step 910 by first selecting the next setting at step 916.

Those of skill in the art should appreciate that the decision of step 914 may also be based on a predetermined amount of settings or other threshold settings. For example, the other threshold settings may include, by way of illustration, a threshold value (low or high value), a time constraint for evaluation, a practicality constraint if the solution may be difficult to determine. In any of these embodiments, if the predetermined amount of settings have not been selected, then the process reverts to step 910 by first selecting the next setting at step 916.

In any of the embodiments, after the set amount of settings are selected and used to generate the pupilgram and resist images, the process will continue to step 918. At step 918, the resist images of the matching tool are stored in a database, for example. At step 920, the program control receives resist data of the target tool. This may be input by the user, for example. At step 922, the program control selects a characterization method for the target tool. The selection of the characterization method may be provided directly after step 918. In any of these scenarios, for example, the program control can characterize the resist images by use of a single or multiple CD calculation for each image, or for other characteristic profile metrics described herein. It is also possible to have user defined weighting of the metrics, at this processing stage. That is, as in all of the embodiments, the set of test features can be optionally weighted in the case that some features are more important than others.

At step 924, the profile metric response table of the matching tool are stored in the database. At step 926, the program control selects a merit function such as, for example, $$M_s = \left( \sum_p (C_p^T - C_{p,s}^M)^2 \right)^{1/2}.$$

At step 928, the program control constructs a response function of the matching tool. For example, in embodiments, the nonlinear optimizer will calculate the responses of the matching tool based on the adjustments made to the matching tool. In this way, the nonlinear optimizer can determine a response of the matching tool over many different adjustments. At step 930, the program control will search the response surface for the settings. As noted above, the setting may be all of the settings or a predetermined amount of settings, which are used to describe the response surface.

At step 932, the program control evaluates the merit function. That is, the program control will use the response surface generated for the matching tool and compare the response to the target tool in order to calculate a merit function. At step 934, the program control will determine whether the merit function is optimized. For example, the program control will determine if the merit function is zero, close to zero or at a predetermined value. The smallest difference between the matching tool and the target tool is optimal/desirable. If the merit function is not optimized, the process will revert to step 930. Once the merit function is optimized, the process will end at step 936, at which time the target tool and the matching tool will have matching settings (substantially matching settings or settings that meet a predetermined threshold match).

In embodiments, if the merit function cannot be optimized, the program control can notify the user of such instance. In the cases where all of the settings are not selected at step 914, the program control can select additional settings in order to perform the subsequent processes in order to optimize the merit function. In embodiments, the program control can determine addition settings that may perform closely to the target tool performance through interpolation or extrapolation methods.

Ratio Method

Figure 10:
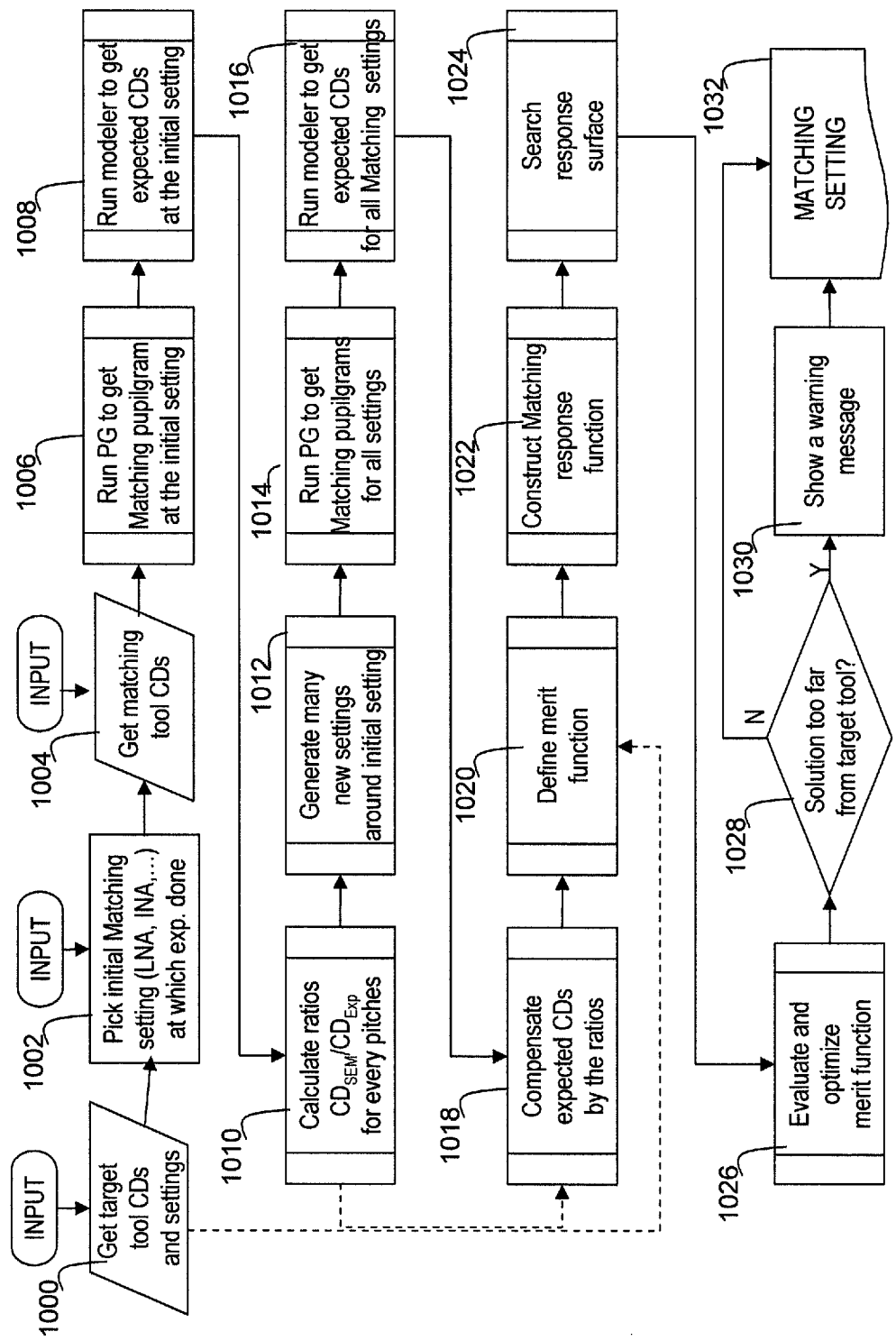
FIG. 10 shows a process flow for ratio-method OPE matching in accordance with an aspect of the invention.

FIG. 10 shows a process flow for ratio-method modeling in accordance with an aspect of the invention. In the ratio-method mode, the program control performs aerial-image modeling and then estimates resist results for the matching tool using a ratio of resist CD to aerial-image CD At step 1000, the target tool CD and settings (e.g., LNA, INA, AR, etc.) are obtained (input) from the user (customer). The target tool information can be stored in a database. At step 1002, the program control selects initial settings for the matching tool, for example, LNA, INA and AR. For example, the initial settings may be obtained by selecting the same settings which are provided on the target tool for the desired performance. The settings of the matching tool may also be stored in a database. At step 1004, the CDs of the matching tool are obtained (input) from the user (customer). The matching tool CDs may be obtained by experimental data based on settings of the target tool.

At step 1006, the program control obtains a pupilgram of the matching tool based on the initial setting. In embodiments, the pupilgram can be obtained by the matching tool pupilgram generator. At step 1008, the program control obtains expected CDs at the initial settings. In embodiments, the expected CDs can be obtained by the lithographic modeler. At step 1010, the program control calculates ratios for each pitch. More specifically, at step 1010, the program control calculates the width of the aerial-image features (CD) and uses the measured resist CD to calculate a ratio $$r_p = \frac{CD_p^{SEM}}{CD_p^A}$$

where $CD_p^{SEM}$ represents the measured resist CD at pitch p and $CD_p^A$ represents an aerial-image CD at the same pitch p.

At step 1012, the program control generates new settings of the matching tool around the initial settings. At step 1014, after the settings are generated, the process control generates the pupilgram for the settings. The pupilgram may be generated by the matching tool pupilgram generator. As with the previous embodiments, the pupilgram may be generated for all of the settings or a predetermined amount of settings. The pupilgrams may be stored in the database (e.g., storage system 30).

At step 1016, the program control obtains the expected CDs for the matching tool settings. The CDs may be generated by running the lithographic modeler in the aerial image mode. At step 1018, the program control compensates for the expected CDs by the ratio obtained in step 1010. More specifically, in this instance it would divide the target-tool CDs at each pitch by the ratio $r_p$ described above to obtain an estimated aerial-image CD for the target tool. In this way the program can compare aerial-image CD from the matching tool to the estimated aerial-image CD from the target tool. At step 1020, the program control selects (defines) a merit function such as, for example, $$M_s = \left( \sum_p (C_p^T - C_{p,s}^M)^2 \right)^{1/2}$$

At step 1022, the program control constructs a response function of the matching tool. For example, in embodiments, the nonlinear optimizer will calculate the responses of the matching tool based on the adjustments made to the matching tool. In this way, the nonlinear optimizer can determine a response of the matching tool over many different adjustments. At step 1024, the program control will search the response surface for the settings. As noted above, the setting may be all of the settings or a predetermined amount of settings, which are used to describe the response surface.

At step 1026, the program control evaluates and optimizes the merit function. The evaluation and optimization may be performed in the same or different steps. At step 1028, the program control determines whether the merit function is optimized (e.g., too far from the target tool). For example, the program control determines if the merit function is zero, close to zero or at a predetermined value. The smallest difference between the matching tool and the target tool is optimal/desirable. If the merit function is not optimized, the process will show a warning message at step 1030.

The process control can also revert to step 1012 to select new settings by, for example, interpolation or extrapolation methods (in order to obtain settings that may be closer to the performance target). Once the merit function is optimized, the process will end at step 1032, at which time the target tool and the matching tool will have matching settings (substantially matching settings or settings that meet a predetermined threshold match).

Combined Modeling Flow

Figure 11:
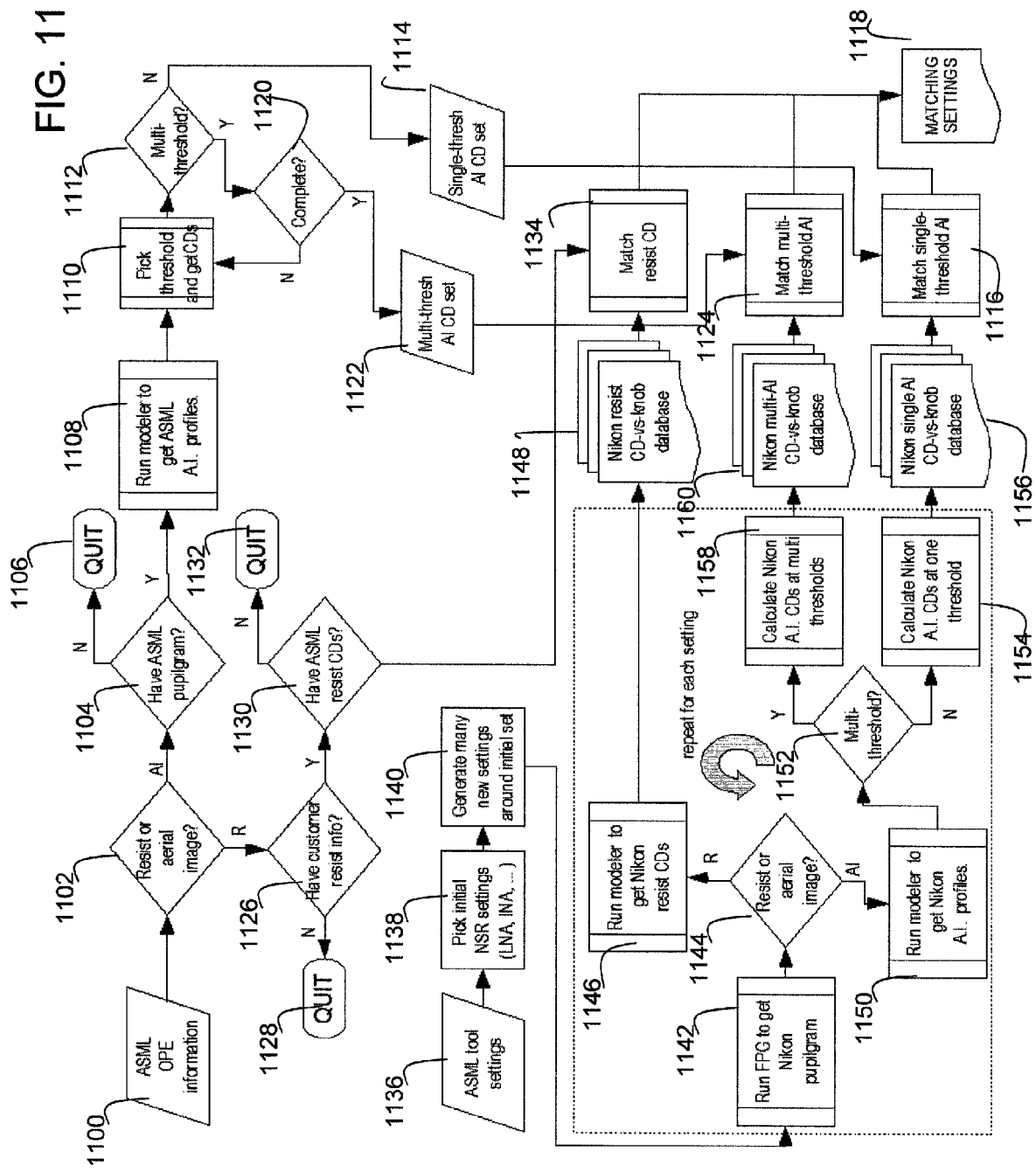
FIG. 11 shows a process flow for a combined resist and aerial imaging process in accordance with an aspect of the invention.

FIG. 11 shows a process flow for a combined resist and aerial imaging process in accordance with an aspect of the invention. In the flow of FIG. 11, the matching tool is a Nikon scanner and the target tool is an ASML scanner. However, it should be understood by those of skill in the art that the use of Nikon and ASML scanners are merely illustrative examples, and the present invention should not be limited by use of such scanners in the description of the flow of FIG. 11.

At step 1100, the ASML OPE information is obtained from the user (customer). At step 1102, the program control determines whether to use a resist image or aerial image method. If an aerial image method is to be used, at step 1104, the program control determines the availability of the pupilgram for the ASML tool. If not available, the process ends at step 1106. If the pupilgram of the ASML tool is available, at step 1108, the lithographic modeler will generate the aerial image profiles of the ASML tool.

At step 1110, the program control will select a threshold and obtain CDs. At step 1112, the program control will determine whether the process will use multiple threshold matching method or a single threshold matching method. (Refer to, for example, FIGS. 2 and 3.) If the process is to use a single threshold matching, the program control will generate the aerial image CD for a single threshold at step 1114. At step 1116, the program control will match the single threshold aerial image of the Nikon tool with that of the ASML tool (e.g., FIG. 2) and, at step 1118, the program control will the set the Nikon tool with the matching settings.

Returning to step 1112, if a multi-threshold matching is to be used, at step 1120, the program control determines whether all of the thresholds have been generated. If not, the program control will return to step 1110. If all of the thresholds are completed, at step 1122, the program control will obtain the multi-threshold aerial image CD set. At step 1124, the program control will match the multiple threshold aerial images of the Nikon tool with that of the ASML tool (e.g., FIG. 3) and, at step 1118, the program control will set the Nikon tool with the matching settings.

Returning to step 1102, if the resist image method is to be used, the program control makes a determination at step 1126 as to whether the customer has the required resist information. If not, the process ends at step 1128. If the customer has the required resist information, at step 1130, the program control will determine the availability of the ASML resist CDs. If the resist CDs are not available, the process ends at step 1132. If the resist CDs are available, the process continues to step 1134. At step 1134, the program control will match the resist CDs of the Nikon tool with that of the ASML tool and, at step 1118, the program control will the set the Nikon tool with the matching settings.

At step 1136, the ASML tool settings are obtained. At step 1138, the initial settings of the Nikon tool are selected such as, for example, the LNA, INA, AR, etc. At step 1140, the program control will generate new settings for the Nikon tool, around the initial setting. As step 1142, the pupilgram generator will simulate pupilgrams for the Nikon tool based on the settings. At step 1144, the program control will determine whether to use a resist image method or aerial image method.

If a resist model is to be used, at step 1146, the lithographic modeler will generate resist CDs for the Nikon tool. At step 1148, a database will be made containing the resist CDs indexed by value of the Nikon knob adjustments. At step

1134, the program control will match the resist CDs of the Nikon tool with that of the ASML tool and, at step 1118, the program control will then provide the matching settings to be used on the Nikon tool.

Returning to step 1144, if an aerial image model is to be used, at step 1150, the lithographic modeler generates aerial image profiles of the Nikon tool. At step 1152, the program control will determine whether the process will use multiple threshold matching or a single threshold matching. If the process is to use a single threshold matching, the program control will generate the aerial image CD for a single threshold at step 1154. At step 1156, a database can be made containing the aerial-image CDs indexed by value of the Nikon knob adjustments. At step 1116, the program control will match the single threshold image of the Nikon tool with that of the ASML tool and, at step 1118, the program control will then provide the matching settings to be used on the Nikon tool.

Returning to step 1152, if multiple threshold matching is to be used, at step 1158, the program control calculates aerial image CDs for the Nikon tool at multiple thresholds. At step 1160, a database can be made containing the multiple-threshold aerial-image CDs indexed by value of the Nikon knob adjustments. At step 1124, the program control will match the multiple threshold images of the Nikon tool with that of the ASML tool and, at step 1118, the program control will then provide the matching settings to be used on the Nikon tool.

Exemplary Photolithographic Apparatus
Implementing Aspects of the Invention

Figure 12:
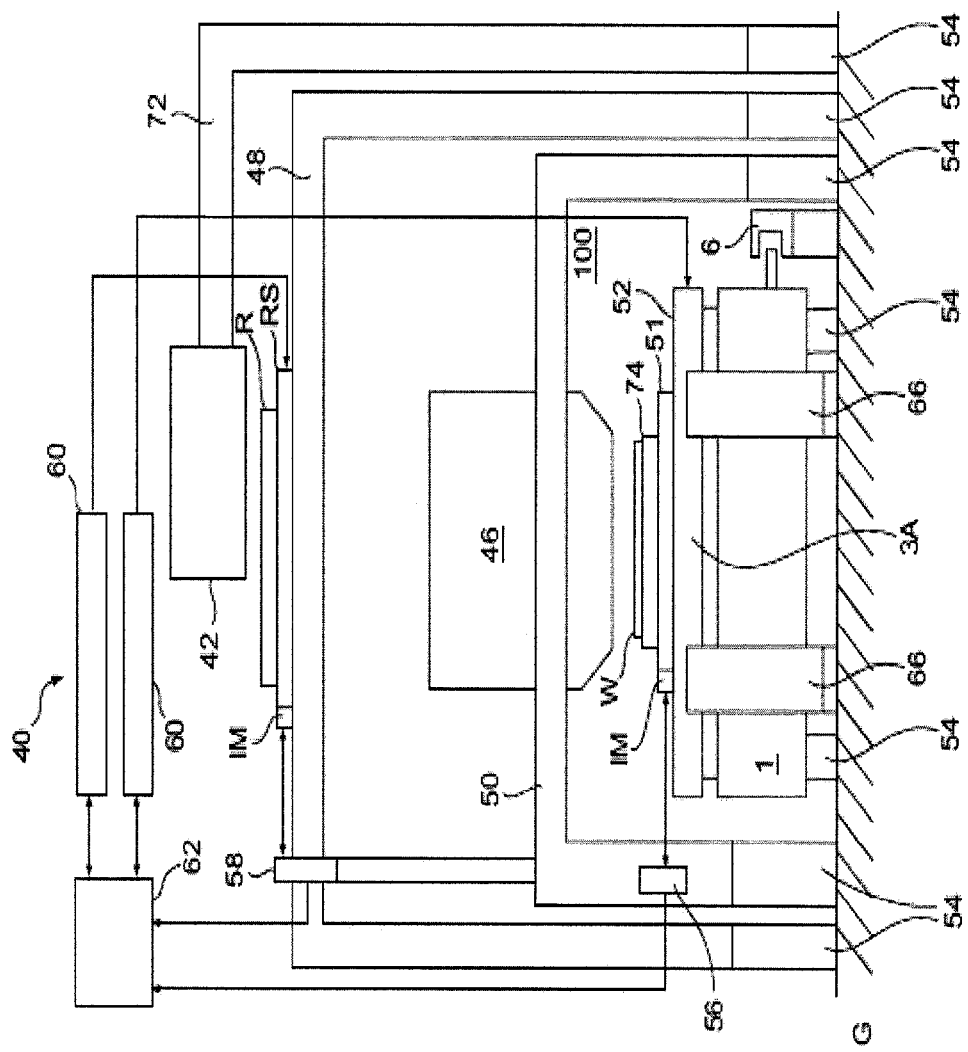
FIG. 12 is a schematic view illustrating a photolithography apparatus according to an aspect of the invention.

FIG. 12 is a schematic view illustrating a photolithography apparatus (exposure apparatus) 40 in accordance with the present invention. The wafer positioning stage 52 includes a wafer stage 51, a base 1, a following stage and following stage base 3A, and an additional actuator 6. The wafer stage 51 comprises a wafer chuck that holds a wafer W and an interferometer mirror IM. The exposure apparatus can also include an encoder to measure stage position. The base 1 is supported by a plurality of isolators 54 (or a reaction frame). The isolators 54 may include a gimbal air bearing. The following stage base 3A is supported by a wafer stage frame (reaction frame) 66. The additional actuator 6 is supported on the ground G through a reaction frame. The wafer positioning stage 52 is structured so that it can move the wafer stage 51 in multiple (e.g., three to six) degrees of freedom under precision control by a drive control unit and system controller, and position and orient the wafer W as desired relative to the projection optics 46. In this embodiment, the wafer stage 51 has six degrees of freedom by utilizing the Z direction forces generated by the x motor and the y motor of the wafer positioning stage 52 to control a leveling of the wafer W. However, a wafer table having three degrees of freedom (Z, θx, θy) or six degrees of freedom can be attached to the wafer stage 51 to control the leveling of the wafer. The wafer table includes the wafer chuck, at least three voice coil motors (not shown), and bearing system. The wafer table is levitated in the vertical plane by the voice coil motors and supported on the wafer stage 51 by the bearing system so that the wafer table can move relative to the wafer stage 51.

The reaction force generated by the wafer stage 51 motion in the X direction can be canceled by motion of the base 1 and the additional actuator 6. Further, the reaction force generated by the wafer stage motion in the Y direction can be canceled by the motion of the following stage base 3A.

An illumination system 42 is supported by a frame 72. The illumination system 42 projects radiant energy (e.g., light) through a mask pattern on a reticle R that is supported by and scanned using a reticle stage. Alternatively, in the case of systems using extreme ultraviolet (EUV) radiation, radiant energy is reflected by the reticle R. The reticle stage may have a reticle coarse stage for coarse motion and a reticle fine stage for fine motion. In this case, the reticle coarse stage corresponds to the translation stage table 100, with one degree of freedom. The reaction force generated by the motion of the reticle stage can be mechanically released to the ground through a reticle stage frame and the isolator 54, in accordance with the structures described in JP Hei 8-330224 and U.S. Pat. No. 5,874,820, the entire contents of which are incorporated by reference herein. The light is focused by a projection optical system (lens assembly) 46 supported on a projection optics frame and released to the ground through isolator 54. The lens assembly 46 may include transmitting glass elements (refractive), reflecting mirrors (reflective) or a combination of the two (catadioptric).

An interferometer 56 is supported on the projection optics frame and detects the position of the wafer stage 51 and outputs the information of the position of the wafer stage 51 to the system controller. A second interferometer 58 is supported on the projection optics frame and detects the position of the reticle stage and outputs the information of the position to the system controller. The system controller controls a drive control unit to position the reticle R at a desired position and orientation relative to the wafer W or the projection optics 46.

There are a number of different types of photolithographic devices which can implement the present invention. For example, apparatus 40 may comprise an exposure apparatus that can be used as a scanning type photolithography system, which exposes the pattern from reticle R onto wafer W with reticle R and wafer W moving synchronously. In a scanning type lithographic device, reticle R is moved perpendicular to an optical axis of projection optics 46 by reticle stage and wafer W is moved perpendicular to an optical axis of projection optics 46 by wafer positioning stage 52. Scanning of reticle R and wafer W occurs while reticle R and wafer W are moving synchronously but in opposite directions along mutually parallel axes parallel to the x-axis.

Alternatively, exposure apparatus 40 can be a step-and-repeat type photolithography system that exposes reticle R while reticle R and wafer W are stationary. In the step and repeat process, wafer W is in a fixed position relative to reticle R and projection optics 46 during the exposure of an individual field. Subsequently, between consecutive exposure steps, wafer W is consecutively moved by wafer positioning stage 52 perpendicular to the optical axis of projection optics 46 so that the next field of semiconductor wafer W is brought into position relative to projection optics 46 and reticle R for exposure. Following this process, the images on reticle R are sequentially exposed onto the fields of wafer W so that the next field of semiconductor wafer W is brought into position relative to projection optics 46 and reticle R.

However, the use of apparatus 40 provided herein is not limited to a photolithography system for semiconductor manufacturing. Apparatus 40 (e.g., an exposure apparatus), for example can be used as an LCD photolithography system that exposes a liquid crystal display device pattern onto a rectangular glass plate or a photolithography system for manufacturing a thin film magnetic head.

In the illumination system 42, the illumination source can be g-line (436 nm), i-line (365 nm), KrF excimer laser (248 nm), ArF excimer laser (193 nm), $F_2$ laser (157 nm) or EUV (13.5 nm).

With respect to projection optics 46, when far ultra-violet rays such as the excimer laser is used, glass materials such as quartz and fluorite that transmit far ultra-violet rays are preferably used. When the $F_2$ type laser, projection optics 46 should preferably be either catadioptric or refractive (a reticle should also preferably be a reflective type). When extreme ultra-violet (EUV) rays or x-rays are used the projection optics 46 should preferably be fully reflective, as should the reticle.

Also, with an exposure device that employs vacuum ultra-violet radiation (VUV) of wavelength 200 nm or shorter, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japanese Patent Application Disclosure No. 10-20195 and its counterpart U.S. Pat. No. 5,835,275. In these cases, the reflecting optical device can be a catadioptric optical system incorporating a beam splitter and concave mirror. Japanese Patent Application Disclosure No. 8-334695 published in the Official Gazette for Laid-Open Patent Applications and its counterpart U.S. Pat. No. 5,689,377 as well as Japanese Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above-mentioned U.S. patents, as well as the Japanese patent applications published in the Office Gazette for Laid-Open Patent Applications are incorporated herein by reference in their entireties.

Further, in photolithography systems, when linear motors that differ from the motors shown in the above embodiments (see U.S. Pat. No. 5,623,853 or 5,528,118) are used in one of a wafer stage or a reticle stage, the linear motors can be either an air levitation type employing air bearings or a magnetic levitation type using Lorentz force or reactance force. Additionally, the stage could move along a guide, or it could be a guideless type stage that uses no guide. The disclosures in U.S. Pat. Nos. 5,623,853 and 5,528,118 are incorporated herein by reference in their entireties.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference in their entireties.

As described above, a photolithography system according to the above described embodiments can be built by assembling various subsystems in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 13:
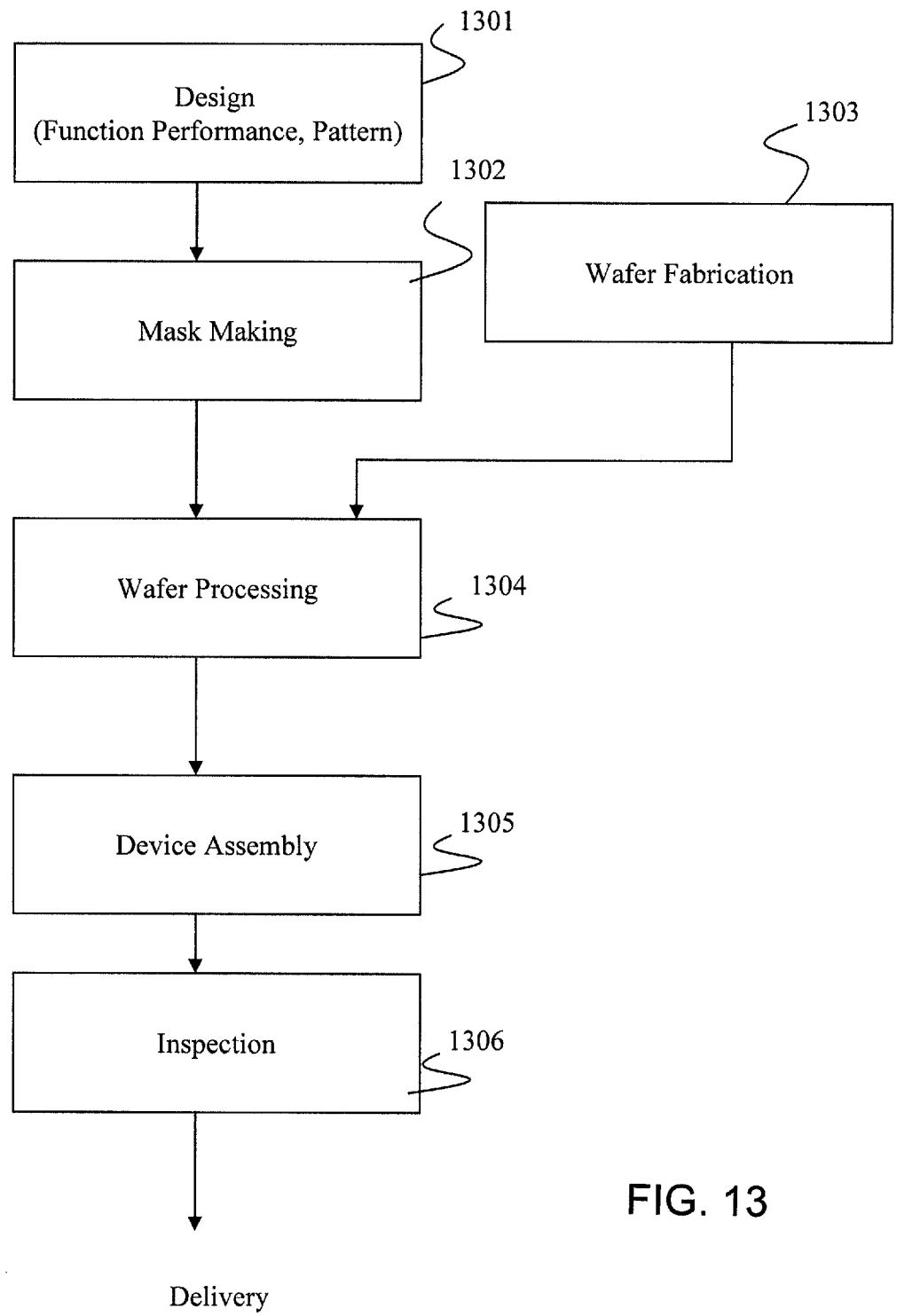
FIG. 13 is a flow chart showing semiconductor device fabrication.

Further, semiconductor devices can be fabricated using the above described systems, by the process shown generally in FIG. 13. In step 1301 the device's function and performance characteristics are designed. Next, in step 1302, a mask (reticle) having a pattern is designed according to the previous designing step, and in a parallel step 1303, a wafer is made from a silicon material. The mask pattern designed in step 1302 is exposed onto the wafer from step 1303 in step 1304 by a photolithography system described hereinabove consistent with the principles of the present invention. In step 1305, the semiconductor device is assembled (including the dicing process, bonding process and packaging process), then finally the device is inspected in step 1306.

Figure 14:
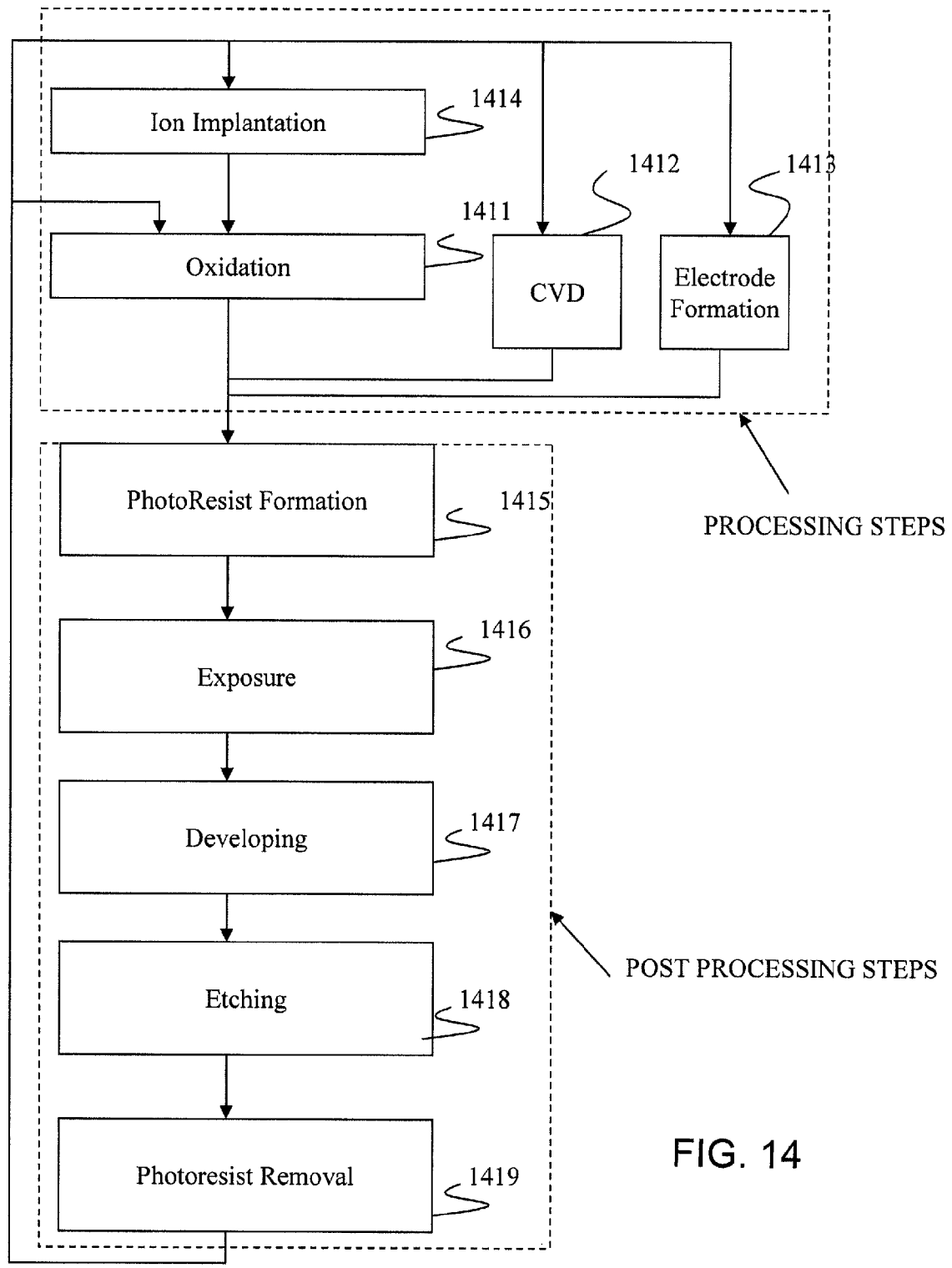
FIG. 14 is a flow chart showing wafer processing.

FIG. 14 illustrates a detailed flowchart example of the above-mentioned step 1304 in the case of fabricating semiconductor devices. In step 1411 (oxidation step), the wafer surface is oxidized. In step 1412 (CVD step), an insulation film is formed on the wafer surface. In step 1413 (electrode formation step), electrodes are formed on the wafer by vapor deposition. In step 1414 (ion implantation step), ions are implanted in the wafer. The above-mentioned steps 1411-1414 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially in step 1415 (photoresist formation step), photoresist is applied to a wafer. Next, in step 1416 (exposure step), the above-mentioned exposure apparatus is used to transfer the circuit pattern of a mask (reticle) to a wafer. Then, in step 1417 (developing step), the exposed wafer is developed, and in step 1418 (etching step), parts other than residual photoresist (exposed material surface) are removed by etching. In step 1419 (photoresist removal step), unnecessary photoresist remaining after etching is removed. Multiple circuit patterns are formed by repetition of these pre-processing and post-processing steps.

The foregoing examples have been provided for the purpose of explanation and are in no way to be construed as limiting of the present invention. While the present invention has been described with reference to exemplary embodiments, it is understood that the words, which have been used herein, are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. A method of making adjustments to a scanner to match compensated optical proximity effects of a target tool, comprising:
running a lithographic model for the target tool;
running a lithographic model on the scanner to match the target tool for a plurality of different settings on the scanner; and
providing settings for the scanner that most closely matches an output of the target tool based on the lithographic models of the target tool and the scanner by measuring a width of an aerial image at a particular height to calculate a matching critical dimension of the model of the target tool and the scanner, wherein the providing is performed by measuring the width of the aerial or resist image at the particular height at least at two locations and forcing aerial images of the scanner and the target tool to match in two places.

2. The method of claim 1, wherein the running of the lithographic model on the scanner uses at least one lens numerical aperture, numerical aperture of the illuminator and annular ratio of a pattern which is produced by an illuminator.

3. The method of claim 1, further comprising making adjustments to the scanner based on the provided settings.

4. The method of claim 1, wherein the settings are provided for the scanner using either aerial image or resist modeling of the target tool.

5. The method of claim 1, wherein the providing of the settings for the scanner includes matching optical proximity effects of the scanner closely to optical proximity effects of the target tool target.

6. The method of claim 1, further comprising using one or more modeled image of the target tool for adjustment of the scanner when certain information of the target tool is available.

7. The method of claim 6, wherein the certain information includes lens numerical aperture, numerical aperture of an illuminator and annular ratio of a pattern which is produced by the illuminator, wherein the one or more modeled image is used when any combination of the following is known: intensity map of illumination pattern produced by the scanner and the target tool; lens value of the target tool; laser bandwidth of the target tool; stage vibration of the target tool; and focus and dose settings of the target tool.

8. The method of claim 1, further comprising performing non-linear optimization using a merit function from a selected scanner to vary the adjustments of the scanner and calculate matching settings of the scanner to the target tool.

9. The method of claim 1, wherein the providing is performed by measuring the width of the modeled image at the particular height, and setting CD1=CD2 such that aerial image #1 of the target tool and aerial image #2 of the scanner have a same CD at a same threshold.

10. The method of claim 1, further comprising determining a range of settings to be modeled on the scanner based on initial settings of the target tool, and the settings to be modeled on the scanner are in a range that is sufficient to encompass the initial settings.

11. The method of claim 1, wherein the lithographic model of at least the target tool is calculated for one of (i) one-dimensional (1-D) and two-dimensional (2-D) aerial-image profiles in air, (ii) 1-D and 2-D aerial-image profiles in unexposed resist, with resist parameters specified by a user, and (iii) 1-D and 2-D profiles in exposed resist, with resist parameters and dose specified by the user.

12. The method of claim 1, wherein the lithographic model of at least the target tool employs at least one of a vectorial aerial image model and selection of first principle and lumped-parameter resist models.

13. The method of claim 1, further comprising accepting settings for lens numerical aperture (LNA), illuminator numerical aperture (INA) or sigma and annular ratio (AR) and calculating a pupilgram or intensity map that is an accurate representation of pupilgram from the scanner.

14. The method of claim 1, further comprising employing calibrated printed image modeling to compare printed images from the scanner to experimental images of the target tool.

15. The method of claim 1, further comprising:
employing aerial image modeling in order to compare modeled aerial image CD from the scanner to experimental resist CD from the scanner; and
calculating a pitch-dependent ratio $$r_p = \frac{CD_p^{SEM}}{CD_p^A},$$

where $CD_p^{SEM}$ represents measured resist CD at pitch p and $CD_p^A$ represents an aerial-image CD at a same pitch p.

16. The method of claim 1, further comprising estimating a target aerial image CD for the target tool by dividing resist CDs of the target tool at pitch p by a corresponding ratio $r_p$ and constructing a merit function describing a match between an aerial-image OPE of the scanner and estimated aerial-image OPE curve of the target tool, at different matching tool settings.

17. A method of making adjustments to a scanner to match a target tool, comprising:
collecting data from the target tool;
running a lithographic model on a scanner to match the target tool for a plurality of different settings on the scanner; and
providing settings for the scanner that most closely matches an output of the target tool based on non-linear optimization using one or more modeled image of the target tool for adjustment of the scanner which includes lens numerical aperture, numerical aperture of an illuminator and annular ratio of a pattern which is produced by the illuminator, wherein the providing is further performed by measuring a width of aerial or resist image at a particular height at least at two locations and forcing aerial images of the scanner and the target tool to match in two places.

18. The method of claim 17, wherein the data from the target tool is modeled data.

19. The method of claim 17, wherein the data from the target tool is experimental data.

20. The method of claim 19, further comprising employing calibrated exposed-resist modeling to compare modeled resist CD from the scanner to experimental resist CD from the target tool.

21. The method of claim 19, further comprising employing measured resist CD from the scanner to calibrate and correct modeled resist CD empirically.

22. The method of claim 19, further comprising using a characterization of a printed image to construct a merit function to be optimized by the non-linear optimization.

23. The method of claim 22, wherein the characterization of a printed image includes at least one of edge slope and corner radii.

24. The method of claim 22, further comprising constructing the merit function describing a match between scanner OPE and target tool OPE curve, at different matching tool settings.

25. The method of claim 22, further comprising constructing the merit function based on a hybrid of resist and aerial-image information.

26. The method of claim 22, wherein the merit function is calculated by calculating a CD ratio from scanner OPE data and scanner OPE modeling, and a ratio of the OPE data and OPE modeling is used to calculate the merit function based on resist CDs of the target tool.

27. The method of claim 22, wherein the non-linear optimization uses a constructed library of the merit function as calculated at available scanner settings.

28. The method of claim 22, wherein the non-linear optimization analyzes the merit function and feedbacks commands to a modeler to construct the merit function in real time, eliminating a need for a library.

29. The method of claim 22, wherein the non-linear optimization uses the merit function to vary adjustments of the scanner and calculates a matching setting by using the scanner adjustments as input parameters to a response function describing an output of the scanner, then entering the response function output into the merit function and finding values of the scanner adjustments that minimize the merit function, thereby minimizing a difference between the scanner and the target tool.

30. The method of claim 17, further comprising:
employing aerial image modeling in order to compare modeled aerial image CD from the scanner to experimental resist CD from the scanner; and
calculating a pitch-dependent ratio $$r_p = \frac{CD_p^{SEM}}{CD_p^{A}},$$

where $CD_p^{SEM}$ represents measured resist CD at pitch p and $CD_p^{A}$ represents an aerial-image CD at the same pitch p.

31. A system implemented on a computer infrastructure comprising:
first program instructions running a lithographic model for a target tool;
second program instructions running a lithographic model on a scanner to match the target tool for a plurality of different settings on the scanner; and
third program instructions providing settings for the scanner that most closely matches an output of the target tool based on the lithographic models of the target tool and the scanner and estimating a target aerial image CD for the target tool by dividing resist CDs of the target tool at pitch p by a corresponding ratio $r_p$ and constructing a merit function describing a match between an aerial-image OPE of the scanner and estimated aerial-image OPE curve of the target tool, at different matching tool settings wherein the providing is further performed by measuring a width of aerial or resist image at a particular height at least at two locations and forcing aerial images of the scanner and the target tool to match in two places, and,
the first, second and third program instructions being stored on a computer readable storage media and being operable on the computer infrastructure.

32. A computer program product comprising a computer readable storage medium having readable program code tangibly embodied in the computer readable storage medium, the computer program product being operable to:
collect data from the target tool;
run a lithographic model on a scanner to match the target tool for a plurality of different settings on the scanner;
provide settings for the scanner that most closely matches an output of the target tool based on non-linear optimization and including measuring a width of aerial or resist image at a particular height at least at two locations and forcing aerial images of the scanner and the target tool to match in two places; and
performing non-linear optimization using a merit function from a selected scanner to vary the adjustments of the scanner and calculate matching settings of the scanner to the target tool.

* * * * *